US007010452B2

(12) United States Patent
Gomes et al.

(10) Patent No.: US 7,010,452 B2
(45) Date of Patent: Mar. 7, 2006

(54) EVENT PIPELINE AND SUMMING METHOD AND APPARATUS FOR EVENT BASED TEST SYSTEM

(75) Inventors: Glen Gomes, Santa Clara, CA (US); Anthony Le, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 87 days.

(21) Appl. No.: 10/618,387

(22) Filed: Jul. 12, 2003

(65) Prior Publication Data

US 2004/0107058 A1 Jun. 3, 2004

Related U.S. Application Data

(60) Provisional application No. 60/396,040, filed on Jul. 13, 2002.

(51) Int. Cl.
*G06F 11/00* (2006.01)
(52) U.S. Cl. .................. 702/117; 702/118; 702/124; 714/724
(58) Field of Classification Search .................. 702/79, 702/108, 117, 118, 120, 124–126, 176, 178, 702/186, 187, 189, 183, 185, 119; 714/715, 714/730, 731, 728, 724, 718, 738, 739, 732, 714/799, 23, 32–34, 39, 742; 365/201; 324/765, 324/73.1; 713/300, 302, 400, 401, 600, 601
See application file for complete search history.

(56) References Cited

U.S. PATENT DOCUMENTS

| 5,212,443 A | 5/1993 | West et al. .................. 714/724 |
| 5,225,772 A | 7/1993 | Cheung et al. ............. 324/73.1 |
| 5,592,659 A | 1/1997 | Toyama et al. .............. 713/503 |
| 6,226,765 B1 | 5/2001 | Le et al. ...................... 714/718 |
| 6,360,343 B1 * | 3/2002 | Turnquist ..................... 714/731 |
| 6,532,561 B1 * | 3/2003 | Turnquist et al. ........... 714/738 |
| 6,557,133 B1 | 4/2003 | Gomes ........................ 714/738 |
| 6,578,169 B1 | 6/2003 | Le et al. ...................... 714/736 |
| 6,594,609 B1 * | 7/2003 | Le et al. ...................... 702/117 |
| 6,668,331 B1 * | 12/2003 | Gomes et al. ............... 713/401 |
| 2003/0229473 A1 | 12/2003 | Gomes et al. ............... 702/187 |

\* cited by examiner

*Primary Examiner*—Hal Wachsman
(74) *Attorney, Agent, or Firm*—Muramatsu & Associates

(57) ABSTRACT

An event pipeline and vernier summing apparatus for high speed event based test system processes the event data to generate drive events and strobe events with various timings at high speed to evaluate a semiconductor device under test. The event pipeline and vernier summing apparatus is configured by an event count delay logic, a vernier data decompression logic, an event vernier summation logic, an event scaling logic, and a window strobe logic. The event pipeline and summing method and apparatus of the present invention is designed to perform high speed event timing processing with use of a pipeline structure. The window strobe logic provides a function for detecting a window strobe request and generating a window strobe enable.

19 Claims, 35 Drawing Sheets

Prior Art
Fig. 2A
(Clock)
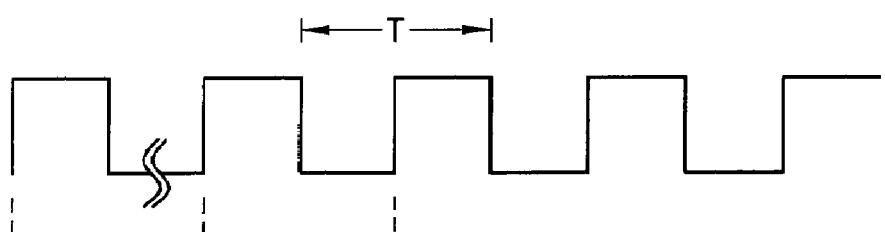
Fig. 2B
(Delay)
Fig. 2C
(Drive Event)
Event 0          Event 1          Event 2
Fig. 2D
(Strobe Event)
Event 0          Event 1          Event 2

Fig. 4B

| Event | Event Count | Event Vernier | Event Type |
|---|---|---|---|
| E0 | C0 | V0 | Drive Low |
| E1 | C1 | V1 | Drive High |
| E2 | C2 | V2 | Drive Low |
| E3 | C3 | V3 | Drive High |
| E4 | C4 | V4 | Drive Low |
| E5 | C5 | V5 | Drive High |
| E6 | C6 | V6 | Drive Low |
| E7 | C7 | V7 | Drive High |
| E8 | C8 | V8 | Drive Low |

Fig. 6A

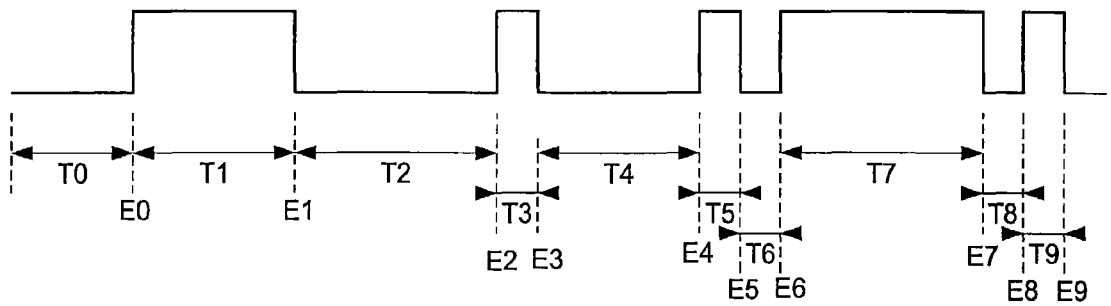

Fig. 6B

| Event | Event Count Data | Event Vernier Data |
|---|---|---|
| E0 | T0 count data | T0 vernier |
| E1 | T1 count data | T1 vernier |
| E2 | T2 count data | T2 vernier |
| E3 | T3 count data | T3 vernier |
| E4 | T4 count data | T4 vernier |
| E5 | T5 count data | T5 vernier |
| E6 | T6 count data | T6 vernier |
| E7 | T7 count data | T7 vernier |
| E8 | T8 count data | T8 vernier |
| E9 | T9 count data | T9 vernier |

Fig. 6C

| Event | Event Count Memory | Event Vernier Memory |
|---|---|---|
| E0 | T0 count data (Word 0) | 0, 0, 0, T0 vernier |
| E1 | T1 count data (Word 0) | 0, T2 vernier, 0, T1 vernier |
|  | T1 count data (Word 1) | T4 vernier, 0, 0, T3 vernier |
| E2, E3 | T2 count data (Word 0) | 0, 0, T6 vernier, T5 vernier |
|  | T2 count data (Word 1) | 0, T9 vernier, T8 vernier, T7 vernier |
|  | T2 count data (Word 2) | (next vernier data) |
| E4, E5, E6 | T4 count data (Word 0) | (next vernier data) |
|  | T4 count data (Word 1) | (next vernier data) |
|  | T4 count data (Word 2) | (next vernier data) |
|  | T4 count data (Word 3) | (next vernier data) |
| E7, E8, E9 | T7 count data (Word 0) | (next vernier data) |

Fig. 9

| Address | Bit[7] | Bit[6:5] | Bit[4:0] |
|---|---|---|---|
| Single Word | | | |
| N | 0 | EVCNT[1:0] | COUNT[4:0] |
| Double Word | | | |
| N | 0 | EVCNT[1:0] | COUNT[4:0] |
| N+1 | 1 | COUNT[11:10] | COUNT[9:5] |
| Triple Word | | | |
| N | 0 | EVCNT[1:0] | COUNT[4:0] |
| N+1 | 0 | COUNT[11:10] | COUNT[9:5] |
| N+2 | 1 | COUNT[18:17] | COUNT[16:12] |
| Quad Word | | | |
| N | 0 | EVCNT[1:0] | COUNT[4:0] |
| N+1 | 0 | COUNT[11:10] | COUNT[9:5] |
| N+2 | 0 | COUNT[18:17] | COUNT[16:12] |
| N+3 | 1 | COUNT[25:24] | COUNT[23:19] |

Fig. 10

| Address | Vernier Pipeline 0 | Vernier Pipeline 1 | Vernier Pipeline 2 | Vernier Pipeline 3 |
|---|---|---|---|---|
| 0x0 | Event 0, Vernier 0 | Event 0, Vernier 1 | Event 0, Vernier 2 | Event 1, Vernier 0 |
| 0x1 | Event 1, Vernier 1 | Event 1, Vernier 2 | Event 1, Vernier 3 | Event 2, Vernier 0 |
| 0x2 | Event 3, Vernier 0 | Event 4, Vernier 0 | Event 4, Vernier 1 | Event 5, Vernier 0 |
| 0x3 | Event 5, Vernier 1 | Event 5, Vernier 2 | Event 6, Vernier 0 | Event 6, Vernier 1 |
| 0x4 | Event 7, Vernier 0 | Event 7, Vernier 1 | Event 8, Vernier 0 | Event 9, Vernier 0 |

Fig. 11

| Event Number | EVCNT [1:0] | ECR Address | EVR Address | Vernier Pipeline 0 | Vernier Pipeline 1 | Vernier Pipeline 2 | Vernier Pipeline 3 |
|---|---|---|---|---|---|---|---|
| 0 | 0x2 | 0x0 | 0x0 | Vernier 0 | Vernier 1 | Vernier 2 | |
| 1 | 0x3 | 0x1 | 0x0-0x1 | Vernier 1 | Vernier 2 | Vernier 3 | Vernier 0 |
| 2 | 0x0 | 0x2 | 0x1 | | | | Vernier 0 |
| 3 | 0x0 | 0x3 | 0x2 | Vernier 0 | | | |
| 4 | 0x1 | 0x4 | 0x2 | | Vernier 0 | Vernier 1 | |
| 5 | 0x2 | 0x5 | 0x2-0x3 | Vernier 1 | Vernier 2 | | Vernier 0 |
| 6 | 0x1 | 0x6 | 0x3 | | | Vernier 0 | Vernier 1 |
| 7 | 0x1 | 0x7 | 0x4 | Vernier 0 | Vernier 1 | | |
| 8 | 0x0 | 0x8 | 0x4 | | | Vernier 0 | |
| 9 | 0x0 | 0x9 | 0x4 | | | | Vernier 0 |

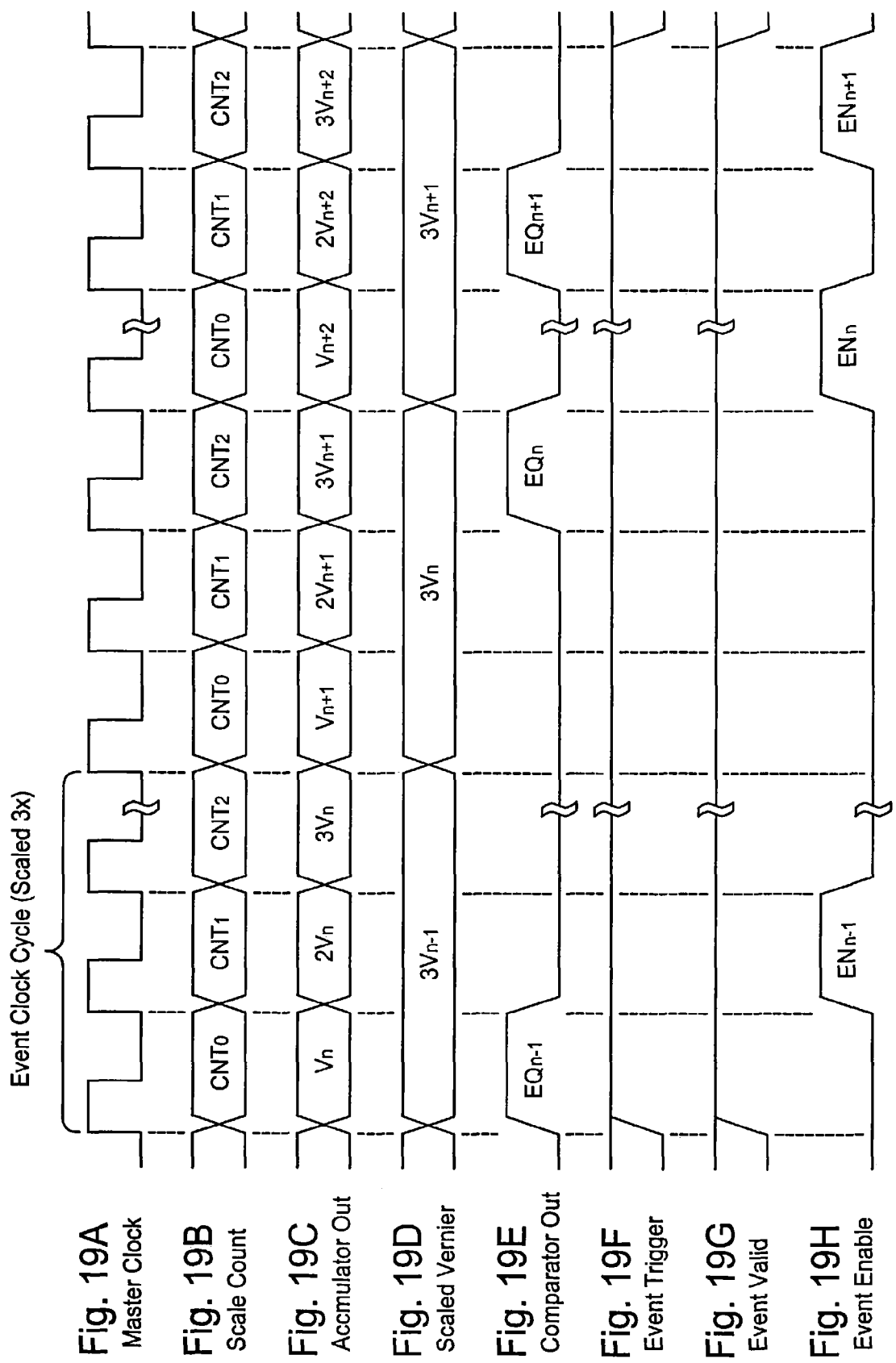

Fig. 20A (Clock)

Fig. 20B (Drive Event)

Fig. 20C (DUT Out)

Fig. 20D (Strobe Event)

| Event | Event Count | Event Vernier | Event Type |
|---|---|---|---|
| E0 | C0 | V0 | Drive Low |
| E1 | C1 | V1 | Drive Low |
| E2 | C2 | V2 | Strobe |
| E3 | C3 | V3 | Drive Low |
| E4 | C4 | V4 | Strobe |
| E5 | C5 | V5 | Strobe |
| E6 | C6 | V6 | Drive Low |
| E7 | C7 | V7 | Drive Low |

Fig. 23A

| Window Strobe Type Comparisons | | | | |
|---|---|---|---|---|
|  | Type 0 | Type 1 | Type 2 | Type 3 |
| Type 0 |  | X | X | X |
| Type 1 | X |  | X | X |
| Type 2 | X | X |  |  |
| Type 3 | X | X | X |  |

Fig. 23B

| Window Strobe Vernier Comparisons | | | | |
|---|---|---|---|---|
|  | Vernier 0 | Vernier 1 | Vernier 2 | Vernier 3 |
| Vernier 0 |  | X | X | X |
| Vernier 1 | X |  | X | X |
| Vernier 2 | X | X |  |  |
| Vernier 3 | X | X | X |  |

Fig. 24A

| Window Strobe Determinations for Vernier 0 | | Type 0 | Type 1 | Type 2 | Type 3 |
|---|---|---|---|---|---|
| Vernier = 0 | Type 0 | | W | W | W |
| | Type 1 | | | | |
| | Type 2 | | | | |
| | Type 3 | | | | |
| Vernier ≠ 0 | Type 0 | | | | |
| | Type 1 | | | | |
| | Type 2 | | | | |
| | Type 3 | | | | |

Fig. 24B

| Window Strobe Determinations for Verniers 1, 2, and 3 | | Type 0 | Type 1 | Type 2 | Type 3 |
|---|---|---|---|---|---|
| Matching Verniers | Type 0 | | | | |
| | Type 1 | | | W | W |
| | Type 2 | | W | | W |
| | Type 3 | | W | W | |
| No Matching Verniers | Type 0 | | | | |
| | Type 1 | | | | |
| | Type 2 | | | | |
| | Type 3 | | | | |

Fig. 26

| Window Strobe Event Type Removals | | | | | |
|---|---|---|---|---|---|
| | | Type 0 | Type 1 | Type 2 | Type 3 |
| Vernier = 0 | Type 0 | | *Type 1* | *Type 2* | *Type 3* |
| | Type 1 | | | | |
| | Type 2 | | | | |
| | Type 3 | | | | |
| Vernier ≠ 0 | Type 0 | | | | |
| | Type 1 | | | | |
| | Type 2 | | | | |
| | Type 3 | | | | |
| Matching Verniers | Type 0 | | | | |
| | Type 1 | | | *Type 2* | *Type 3* |
| | Type 2 | | *Type 1* | | *Type 3* |
| | Type 3 | | *Type 1* | *Type 3* | |
| No Matching Verniers | Type 0 | | | | |
| | Type 1 | | | | |
| | Type 2 | | | | |
| | Type 3 | | | | |

EVENT PIPELINE AND SUMMING METHOD AND APPARATUS FOR EVENT BASED TEST SYSTEM

This application claims the benefit of U.S. Provisional Application No. 60/396,040 filed Jul. 13, 2002.

FIELD OF THE INVENTION

This invention relates to a semiconductor test system for testing semiconductor devices, and more particularly, to an event pipeline and summing method and apparatus for use in an event based semiconductor test system for generating test events of various types and timings at high speed to evaluate semiconductor devices under test.

BACKGROUND OF THE INVENTION

In testing semiconductor devices such as ICs and LSIs by a semiconductor test system, such as an IC tester, a semiconductor IC device to be tested is provided with test signals produced by an IC tester at its appropriate pins at predetermined test timings and waveforms. The IC tester receives output signals from the IC device under test generated in response to the test signals. The output signals are strobed at predetermined timings and results are compared with expected data to determine whether the IC device functions correctly.

The assignee of this invention has developed an event based test system wherein the desired test signals and strobe signals are produced by event data from an event memory directly on a per pin basis. In an event based test system, test data is described in terms of event and its timing where events are any changes of the logic state in the signals used for testing a semiconductor device under test. For example, such changes are rising and falling edges of test signals (drive events) or occurrences of strobe signal (strobe events or sample events). Typically, a timing of each event is defined either as a time length from the most recent event (immediately prior to the current event) or the absolute time of an event.

The basic design of the event tester is disclosed in U.S. Pat. Nos. 6,532,561 and 6,360,343, which is briefly described here. An example of basic structure in the event based test system is shown in a block diagram of FIG. 1. In the example of FIG. 1, the event based test system includes a host computer 12 and a bus interface 13 both are connected to a system bus 14, an internal bus 15, an address control logic 18, a failure memory 17, an event memory 30 consisting of an event count memory (event count RAN) 20 and an event vernier memory (event vernier RAM) 21, an event summing and scaling logic 22, an event generator unit 24, and a pin electronics 26. The event based test system evaluates a semiconductor device under test (DUT) 28 connected to the pin electronics 26.

An example of the host computer 12 is a work station having a UNIX, Window, or other operating system therein. The host computer 12 also provides a user interface to enable a user to instruct the start and stop operation of the test, to load a test program and other test conditions, or to perform test result analysis in the host computer. The host computer 12 interfaces with a hardware test system through the system bus 14 and the bus interface 13.

The internal bus 15 is a bus in the hardware test system for interfacing the functional blocks such as the address control logic (address controller) 18, failure memory 17, event summing and scaling logic 22, and event generator 24.

An example of the address control logic 18 is a tester processor which is exclusive to the hardware test system. The tester processor (address control logic) 18 provides instructions to other functional blocks in the test system based on the test program and conditions from the host computer 12 as well as to generate address data for event memory 30 and failure memory 17. The failure memory 17 stores test results, such as failure information of the DUT 28. The information stored in the failure memory logic 17 is used in the failure analysis stage of the DUT.

In an actual test system, a plurality of sets of event count memory and event vernier memory will be provided, each set of which typically corresponds to a test pin of the test system. The event count and vernier memories 20 and 21 store the timing data for each event of the test signals and strobes. The event count memory (RAM) 20 stores the timing data which is an integer multiple of the reference clock (event count data), and the event vernier memory (RAM) 21 stores timing data which is a fraction of the reference clock (event vernier data).

The event summing and scaling logic 22 is to produce a signal showing overall timing of each event based on the timing data from the event count memory 20 and the event vernier memory 21. Basically, such overall timing signal (event enable) is produced by summing the event count data (integer multiple data) and the event vernier data (the fractional data). During the process of summing the timing data, a carry over operation of the fractional data (offset to the integer data) is also conducted in the timing count and offset logic 22. Further during the process of producing the overall timing signal, timing data may be modified by a scaling factor so that the overall timing can be modified accordingly.

The event generator 24 is to actually generate the events based on the overall timing signal and the vernier sum data from the event summing and scaling logic 22. Typically, an event is generated by delaying the overall timing signal by the value shown in the vernier sum data. The events (drive events and/or strobe events) thus generated are provided to the DUT 28 through the pin electronics 26. Basically, the pin electronics 26 is formed of a large number of components, each of which includes a driver and a comparator as well as switches to establish input and output relationships with respect to the DUT 28.

For producing high resolution timings, as noted above, the time length (delay value) between the events is defined by a combination of an integral part of the reference clock (event count data) and a fractional part of the reference clock (event vernier data). A timing relationship between the event count and the event vernier is shown in a timing chart of FIGS. 2A–2D. In this example, a reference clock (ex. master clock) of FIG. 2A has a time period T. The timings of Event 0, Event 1 and Event 2 of FIG. 2C are related in a manner shown in FIG. 2C. To describe the timing of Event 1 with reference to Event 0, the time difference NT+ΔT between the two events is shown in FIG. 2B where N denotes the event count data, T is a reference clock period, and ΔT denotes the event vernier data which is a fraction of the reference clock period T.

The type of event is either a drive event shown in FIG. 2C or a sampling (strobe) event shown in FIG. 2D. A drive event drives a tester pin or a DUT input pin to a specific voltage level. A strobe event samples the output of the DUT pin at its timing. Ordinarily, a strobe waveform has no or almost no pulse width because it defines a single timing for sampling the output of DUT. However, as shown in FIG. 20D, there is another type of strobe having a significantly large pulse width, i.e, a window strobe, which is one of the subjects of the present invention.

As noted above, in an event based test system, the event data in the event memory is expressed by a time difference between the current event and the previous event. Thus, to produce events according to the event data, an event based test system must be able to calculate the sum of the delays of each event up to the current event. This requires a logic in the test system to keep counting of the delay times expressed in the event count data and the event vernier data from the event memory 30.

In the U.S. Pat. Nos. 6,360,343 and 6,557,133 and U.S. application Ser. No. 10/318,959 (Publication No. US-2003-0229473), owned by the same assignee of this invention, it is disclosed an event summing and scaling logic for calculating a timing of the current event using the event data from the event memory. In the event summing and scaling logic disclosed in the prior inventions, however, high speed reproduction of events was not fully established with use of pipeline processing. Further, compression technology is used for storing the event data in the event memory for saving the memory space. In the event summing and scaling logic disclosed in the prior inventions, high speed processing of decompressed vernier events is not fully established with use of parallel pipelines.

Therefore, what is needed is an event processing apparatus and method for a high speed event based test system which is able to perform high speed event timing processing with use of pipeline structure.

SUMMARY OF THE INVENTION

It is, therefore, an object of the present invention to provide a high speed event based semiconductor test system for producing test vectors at high speed with use of an event pipeline and vernier summation logic.

It is another object of the present invention to provide an architecture of the event pipeline and vernier summing logic having a plurality of pipelines for processing the decompressed vernier data in parallel.

It is a further object of the present invention to provide an architecture of window strobe logic which differentiates a window strobe event from other events, and effectively generates a window strobe enable signal.

More specifically, the event pipeline and summing apparatus of the present invention is comprised of: an event count delay logic which produces a gross delay of event count data, which is an integral part of the event data, by counting a clock for a number of time defined by the event count data; a vernier data decompression logic which reproduces event vernier data which is a fractional part of the event data; an event vernier summing logic which produces event vernier sum data by summing the vernier data from the vernier data decompression logic; and an event scaling logic which changes the event count data from the event count delay logic and the event vernier data from the event vernier summing logic in proportion to a scale factor.

In the event pipeline and summing apparatus, two or more pipelines are incorporated at least in the event vernier summing logic for processing the event vernier data in parallel. The event pipeline and summing apparatus further includes a window strobe logic which causes to generate a window strobe when event data of two consecutive events match with one another.

In the preferred embodiment, the event count data for each event is configured by one or more words where each word of event count data is stored in a different address of the event memory. The event vernier data for each event is configured by vernier delay data and event type data. The event vernier data for each event is divided into one or more segments, and each segment of event vernier data is stored in the same or different address of the event memory.

The event count delay logic includes an event counter which loads the event count data and down-counts the event count data by the clock and produces a terminal count signal when a count result reaches a predetermined value, and an event count state machine which controls an overall operation of the event pipeline and summing logic including a process for loading the event count data into the event counter and a process for generating an event trigger signal in response to the terminal count signal from the event counter.

The event vernier data decompression logic includes a plurality of pre-fetch registers to pre-fetch the one or more segments of the event vernier data, a plurality of loop storage registers which store the vernier data from the pre-fetch registers for performing a loop operation on the segments of the event vernier data, and a vernier data decompression state machine which controls an operation of the vernier data decompression including at least an operation of the pre-fetch registers and loop storage registers.

The event vernier summing logic includes a base accumulator which accumulates vernier delays of the base verniers for all of previous and current events, a plurality of accumulators which accumulate vernier delays of other verniers for all of previous and current events on an accumulated result of the base verniers from the base accumulator; and a carry-sum state machine which controls an overall operation of the event vernier summing logic including sending an instruction to the event scaling logic to insert one cycle of wait state into a current event count cycle when a carry arises in accumulating the vernier delays.

The event scaling logic includes an event vernier scaling logic which produces an event enable signal for each pipeline by scaling the vernier sum data from the event vernier summing logic based on the scale factor, and an event count scaling logic which produces an event clock based on the scale factor and provides the event clock to the event count delay logic.

The event count scaling logic includes a scaling counter logic for up-counting the clock when the event count scaling starts, a comparator which compares an output of the scaling counter logic and the scale factor and produces a terminal count signal when the output of the scaling counter logic reaches the value which is one less than the scale factor, and an AND logic which produces the event clock based on the terminal count signal from the comparator and an extra cycle request from the event vernier summing logic.

Another aspect of the present invention is an event pipeline and summing method for an event based test system. The event pipeline and summing method is configured by various steps for performing the functions in the event pipeline and summing apparatus noted above.

According to the present invention, the event processing for a high speed event based test system can be effectively performed to produce the drive events and strobe events. The event data are compressed by dividing into two or more small words or segments and processed through two or more pipelines in a parallel fashion. The decompression, summing and scaling processes are conducted through the pipeline structure of the present invention. The event pipeline and summing logic also includes the window strobe logic for interpreting the event data and generating the window strobe. As a result, the event pipeline and summation logic of the present invention achieves the high speed event processing and high operational stability in the event based test system.

BRIEF DESCRIPTION OF THE DRAWINGS

FIGS. 2A–2D are timing charts showing a basic relationship between a reference clock and timings of events in the event based test system in the conventional technology.

FIG. 4B is a schematic block diagram showing a concept of event data structure stored in an event memory which describe events for generating the series of events shown in FIG. 4A.

FIGS. 6A–6C show an example of event data compression method, where FIG. 6A is a timing chart showing an example of series of events, FIG. 6B is an example of structure of event data for generating the waveform of FIG. 6A without compression, and FIG. 6C is an example of data structure of event data incorporating a compression technology for generating the waveform of FIG. 6A.

FIG. 9 is a diagram showing an example of data formats of the event count data from the event count memory to be loaded in the event counter of FIG. 7.

FIG. 10 is a diagram showing an example of data formats of the event vernier data in the event vernier memory using the compression technology.

FIG. 11 is a diagram showing a relationship between the event data format in FIG. 9 and the vernier data format in FIG. 10 for each event.

FIGS. 12A–12B are block diagrams showing a basic architecture of an event vernier data decompression logic of FIG. 3 wherein FIG. 12A shows an event vernier state machine and FIG. 12B shows a parallel circuit arrangement for decompressing one or more pieces of vernier data for each event.

FIGS. 19A–19H are waveform charts showing an example of scaling operation by the event scaling logic of FIGS. 16–18 in the present invention when the scaling factor is three (3).

FIGS. 20A–20D are timing charts showing an example of waveforms involved in the event test system for explaining a window strobe to detect a glitch like waveform in the output of the DUT.

FIGS. 23A–23B are diagrams showing an example of comparison rules by the window strobe logic of FIG. 22 for detecting a window strobe.

FIGS. 24A–24B are diagrams showing an example of window strobe determinations by the window strobe logic of FIGS. 22 and 23 for detecting a window strobe.

FIG. 26 is a diagram showing an example of operation for window strobe event type removals by the circuit diagram of FIG. 25.

DETAILED DESCRIPTION OF THE INVENTION

Figure 1:
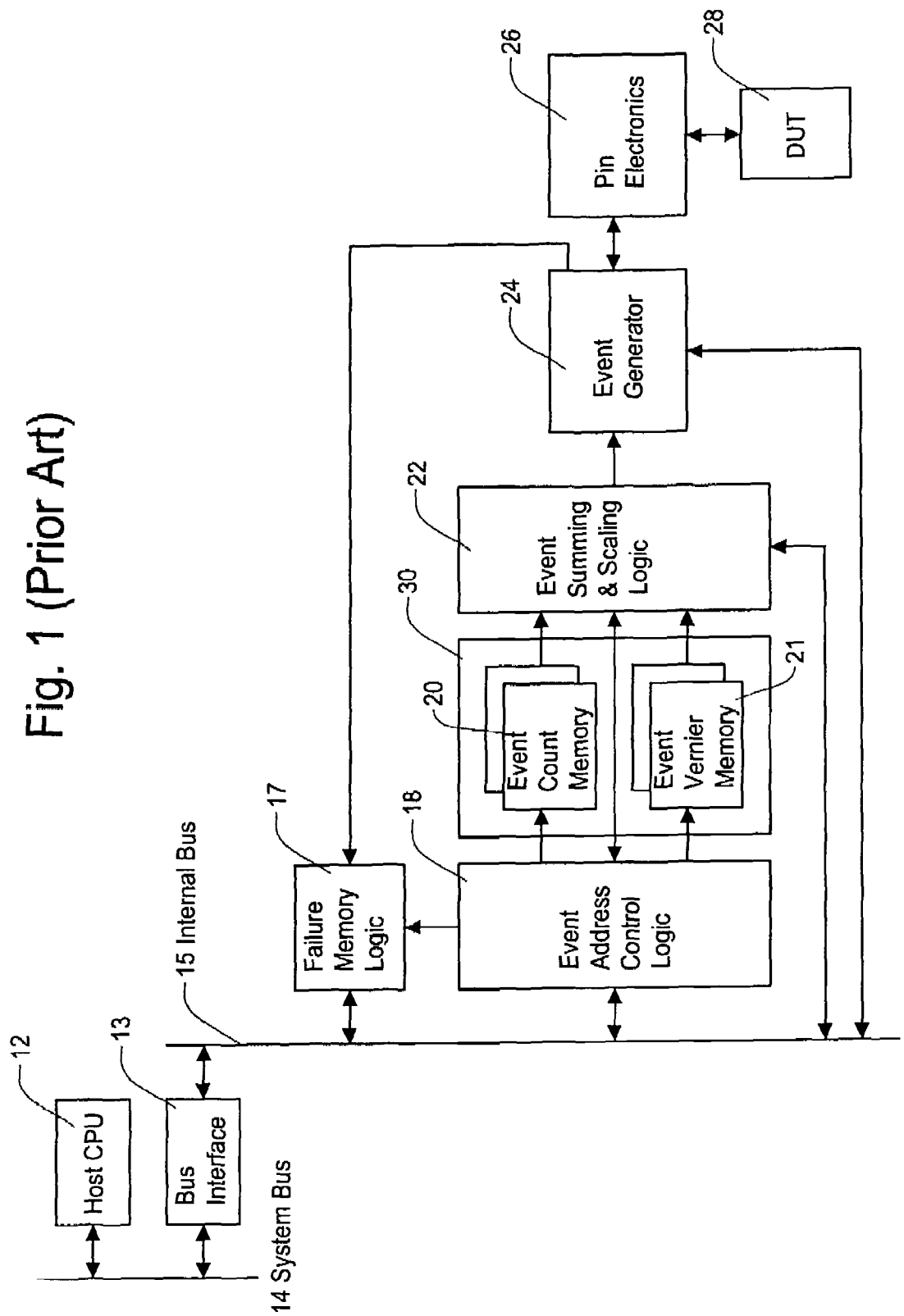
FIG. 1 is a schematic block diagram showing a basic structure of an event based test system in the conventional technology for implementing the event pipeline and summing method and apparatus of the present invention.

Embodiments of the present invention will be described with reference to the accompanying drawings. The event pipeline and summing (EVP) method and apparatus of the present invention is designed to perform high speed event timing processing with use of a pipeline structure. The event pipeline and summing method and apparatus of the present invention is implemented mainly by the event summing and scaling logic 22 and the event address controller 18 in the event based test system shown in FIG. 1.

Figure 3:
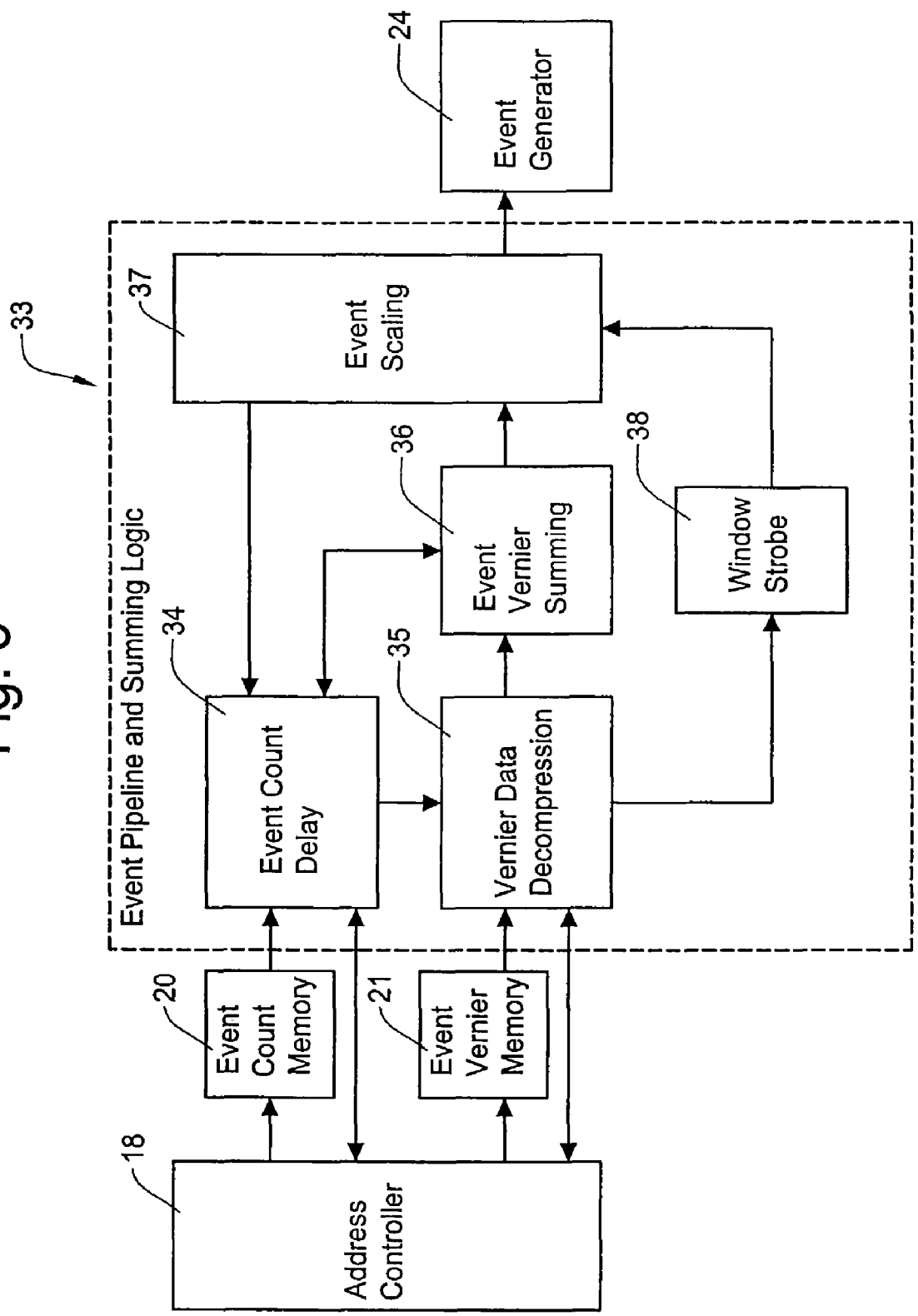
FIG. 3 is a block diagram showing a basic structure of the event pipeline and summing apparatus of the present invention.

FIG. 3 shows a basic configuration of the event pipeline and summing logic 33 of the present invention. The event pipeline and summing logic 33 sends instructions to the address controller 18 and receives address data therefrom. The event pipeline and summing logic 33 also receives the event data from the event memory (event count memory 20 and event vernier memory 21). The event pipeline and summing logic 33 processes the event data and sends the final values of the event data to the event generator 24 which generates test vectors and strobes based on the event data for testing a device under test (DUT). As noted above, the event data is composed of event count data (integral part of the clock cycle) and event vernier data (fractional part of the clock) and event type data.

In FIG. 3, the event pipeline and summing logic 33 includes an event count delay logic 34, a vernier data decompression logic 35, an event vernier summation logic 36, an event scaling logic 37, and a window strobe logic 38. The event count delay logic 34 produces a gross delay of integral parts of the event data from the event count memory 20. The vernier data decompression logic 35 reproduces the vernier data based on the compressed vernier data from the event vernier memory 21. The event vernier summing logic 36 produces event vernier sum data by summing the vernier data from the vernier data decompression logic 35. The event scaling logic 37 changes the event timing data from the event count delay logic 34 and the event vernier summing logic 36 in proportion to a scale factor. The window strobe logic 38 monitors the event type data and vernier data and produces a window strobe when predetermined conditions are met.

Figure 4A:
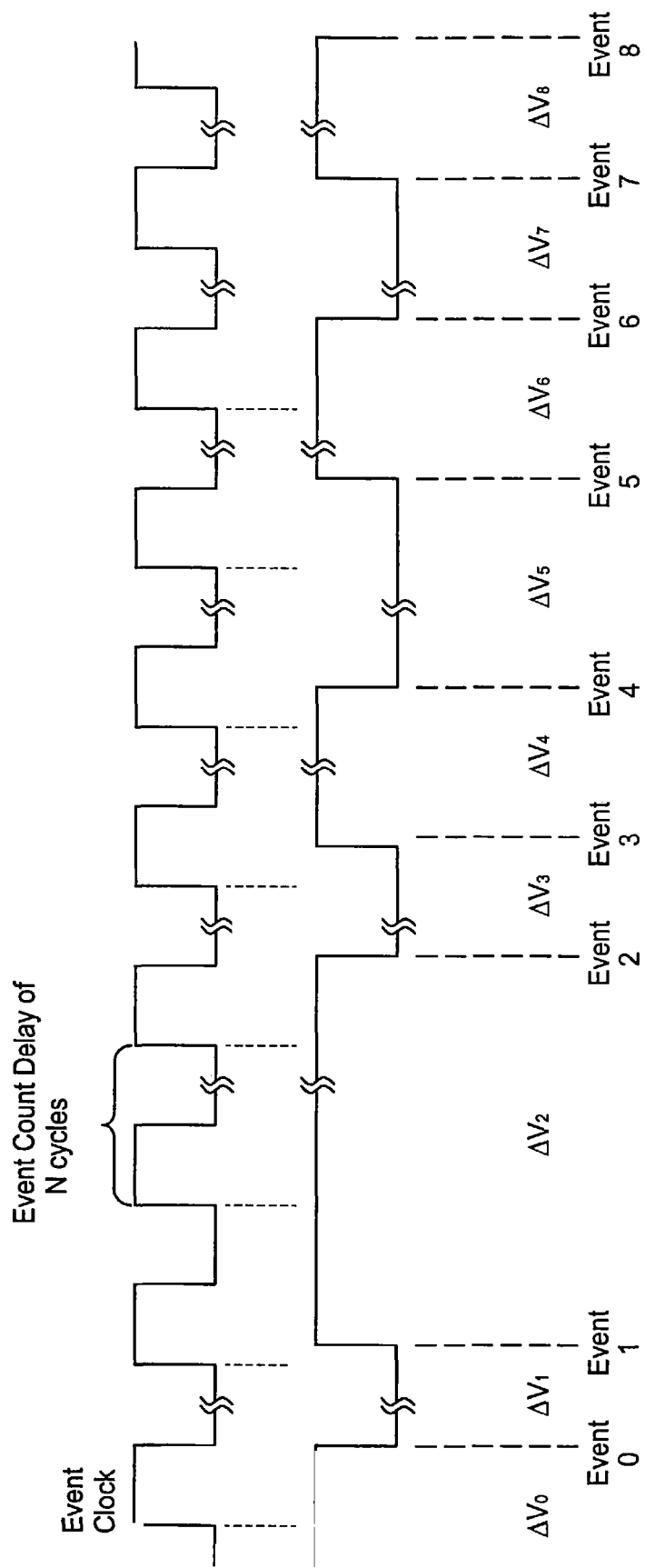
FIG. 4A is a timing charts showing an example of series of events.

Before going into the details of the structure and operation of each logic in the event pipeline and summing logic 33 of FIG. 3, the basic concept involved in the present invention is described with reference to a series of waveforms, event data for generating the waveforms, and a circuit structure for processing the event data. First, the process of event timing computation is considered with reference to FIGS. 4A–4B and 5. FIG. 4A is a waveform diagram showing a sequence of events and FIG. 4B is a data table showing an example of event data stored in an event memory for generating the series of events in FIG. 4A. The waveforms of FIG. 4A show the timing relationship among the events relative to the event clock (or main clock when scale factor is "1"). In the data table of FIG. 4B, the timing data in each and every event is defined by a set of event count data (integral part of reference clock) and event vernier data (fractional part of reference clock).

In the data table of FIG. 4B, each of the events E0–E8 is defined by a time difference from the immediately prior event. Such time differences are denoted by $\Delta V_0, \Delta V_1, \Delta V_2, \ldots \Delta V_8$ in the waveform chart of FIG. 4A. Since each time difference is a time length between two adjacent events, such a time difference is expressed by a combination of the event count data and the event vernier data. The event count data C0–C8 is shown in an "Event Count" column and the vernier data V0–V8 is shown in an "Event Vernier" column of the table. An "Event Type" column defines a type of event for each event such as "Drive Low" (1 to 0) and "Drive High (0 to 1).

For example, the event E2 is apart from the event E1 by $\Delta V_2$ and is defined by the event count data C2 (integral part value) and the vernier data V2 (fractional part value) Thus, the event E2 is expressed as $\Delta V_2 = C2 \times Tp + V2$, where Tp is a one cycle time length of the clock (main clock) Similarly, the event E3 is apart from the event E2 by $\Delta V_3$ and is defined by the event count data C3 (integral part value) and the vernier data V3 (fractional part value). Thus, the event E3 is expressed as $\Delta V_3 = C3 \times Tp + V3$. It should be noted that, for producing the events at the prescribed timings in the manner of FIG. 4A, such time differences $\Delta V_0, \Delta V_1, \Delta V_2, \Delta V_3, \ldots$ between the events must be summed up to determine the timing of the current event.

Figure 5:
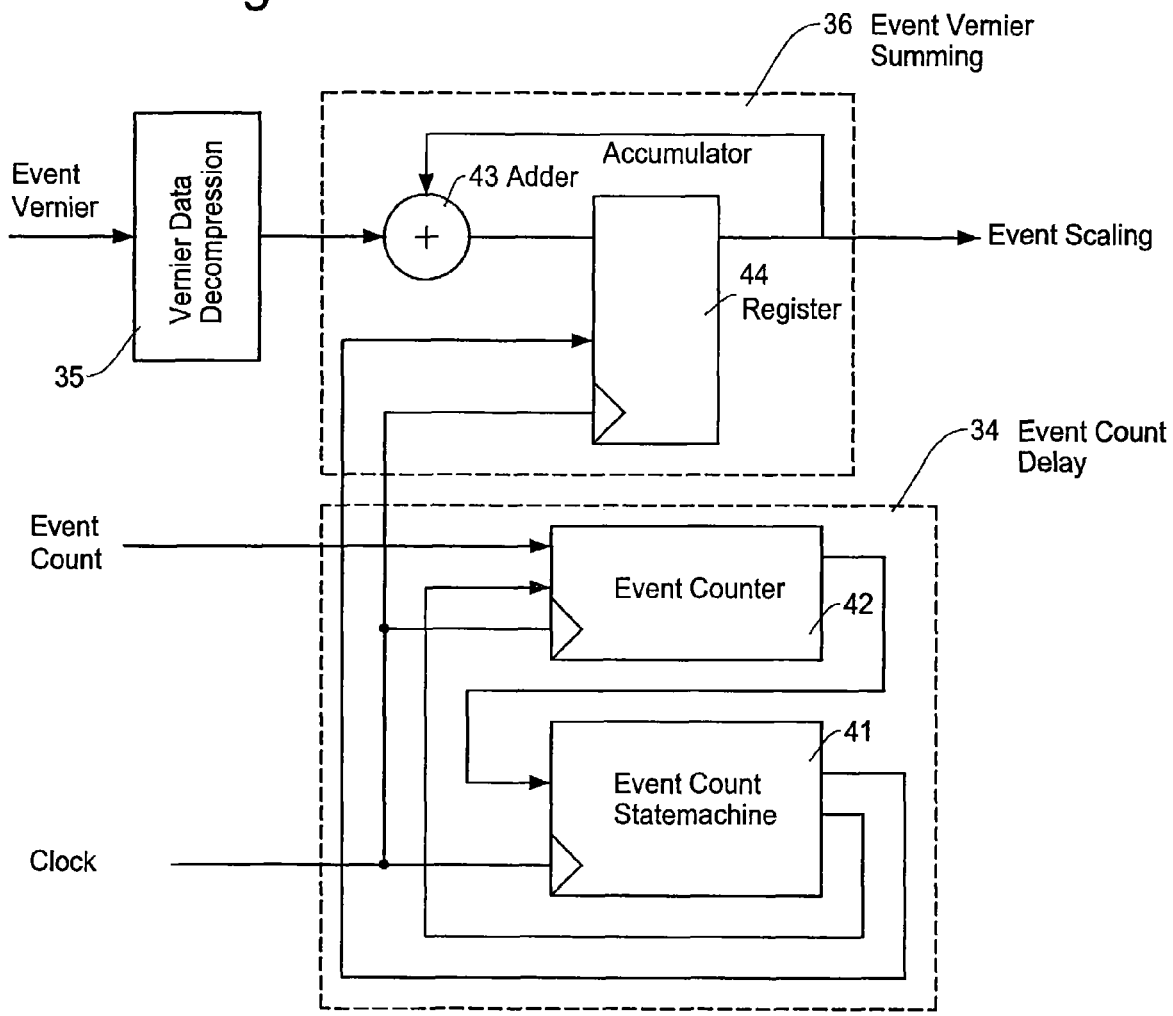
FIG. 5 is a block diagram showing a basic structure of the event count delay unit and event vernier summing unit of FIG. 3 for producing the waveform of FIG. 4A with use of the event data of FIG. 4B.

FIG. 5 is a block diagram showing a simplified structure in the event summing logic for summing the event data shown in FIG. 4B. Namely, the event summing logic reproduces the timing relationship shown in the event waveforms of FIG. 4A by computing the event timings. The event summing logic includes an accumulator formed of an adder 43 and a register 44, an event count logic (event counter) 42 and an event processing state machine 41. The clock is commonly supplied to the state machine 41, the event count logic 42 and the register 44. The event count data from the event memory is provided to the event count logic 42, and the event vernier data from the event memory is provided to the adder 43.

The event count logic 42 is, for example, a down counter which is preset by a numerical value expressed by the event count data. Thus, the event count logic 42 produces a terminal count pulse when the count result reaches a predetermined value such as zero by counting the number of processing clock. Upon receiving the terminal count pulse from the event count logic 42, the event processing state machine 41 produces valid data enable (event trigger, event enable) which is sent to the accumulator in synchronism with the processing clock. The accumulator accumulates the vernier data, and upon receiving the valid data enable from the event processing state machine 41, it produces the accumulated vernier data (vernier sum data). Thus, the accumulated vernier data is supplied to the event generator 24 at the timing defined by the event count data (valid data enable). The event generator 24 has a delay circuit which adds the delay time defined by the accumulated vernier data to the timing of the valid data enable.

Therefore, the event E2 for example, where the event count data is C2 and the event vernier data is V2, a terminal count pulse is produced by the event count logic 42 when counting the processing clock by C2 times. Upon receiving the terminal count pulse, the event state machine 41 produces the valid data enable which is sent to the accumulator. In the accumulator, the vernier data V2 is added to the prior vernier data and the resultant accumulated vernier data is produced at the timing of the valid data enable from the event state machine 41. Based on the event type data (such as drive high or drive low) from the event memory and the accumulated vernier data from the event summing logic, the event generator 24 produces the event E2 which is $\Delta V2$ apart from the event E1.

In the application of semiconductor device testing, the time difference between two events extends from several nanoseconds to several hundred milliseconds. Further, the semiconductor device testing requires a high timing resolution and accuracy. Thus, a large number of bits must be used for the event data to describe the timing of each event, requiring a large capacity in the event memory. Thus, to use the memory capacity more efficiently, a compression technology is preferably incorporated for storing the event data in the event memory.

FIGS. 6A–6C show an example of such an event data compression method. FIG. 6A is a timing chart showing an example of series of events, and FIG. 6B is an example of data structure of event data for generating the waveform of FIG. 6A without using compression. FIG. 6C is an example of data structure of event data incorporating the compression technology for generating the waveform of FIG. 6A. The U.S. Pat. Nos. 6,226,765 and 6,578,169 owned by the same assignee of this invention shows the details of the compression and decompression technology as well as other compression methods for an event based test system.

For generating the waveform of FIG. 6A, a basic data structure such as shown in FIG. 6B can be used as the event data. For simplicity of illustration, event type data is not shown in FIGS. 6B and 6C. In this example, for each event, a total of 27 data bits are assigned to the event count data (event count memory) and 28 data bits are assigned to the event vernier data (event vernier memory). Such a large number of bits are used for each data to cover the maximum anticipated time length and resolution. In many cases, however, each time difference between the adjacent events is much smaller than the maximum possible time length, thus a much shorter length of data bits is sufficient.

Accordingly, in the data structure of FIG. 6C, a data compression (memory compaction) technology is used when storing the event data in the event memory. In this example, the event count data is configured by 1–4 words where one word is composed of eight (8) bits. One word of event count data is stored in one address of the event count memory. The event vernier data is configured by four vernier delays each being seven (7) bits. One or more vernier delays may be used for one event and the maximum of four vernier delays will be assigned to one event. In this manner, by using two or more small words in the event count data and event vernier data, the overall amount of data can be significantly decreased since the maximum number of words are not frequently necessary in the actual application.

Figure 7:
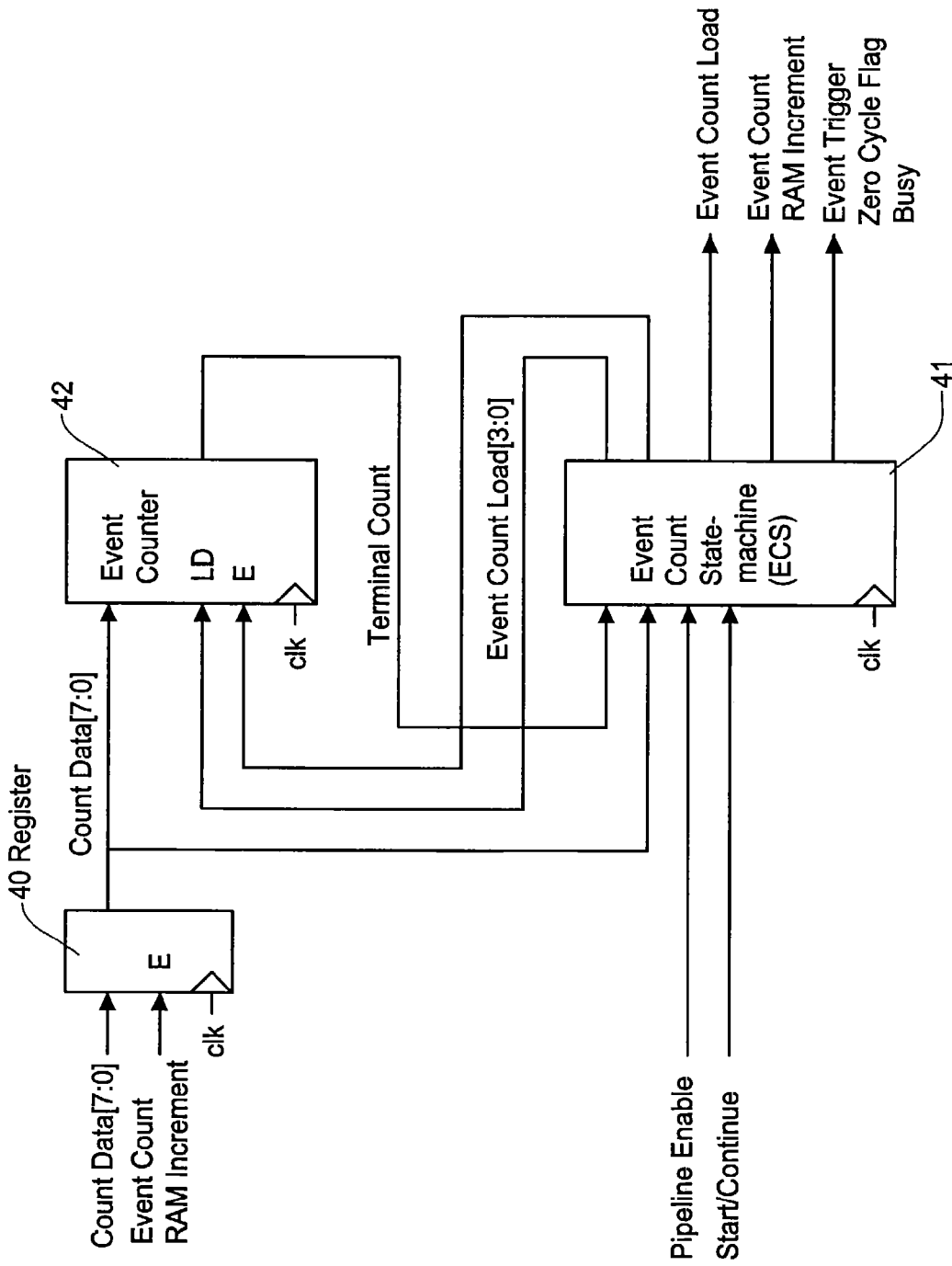
FIG. 7 is a schematic block diagram showing a basic structure of the event count delay logic in the event pipeline and summing logic of the present invention for summing the integral part of the event data.

Now, each logic in the event pipeline and summing apparatus 33 of FIG. 3 is explained in more detail. FIG. 7 is a block diagram showing a configuration of the event count delay logic 34 in FIG. 3. The event count delay logic 34 provides a gross delay based on the test system's event clock. More specifically, the event count delay represents the number of integral event clock counts between events at a device under test (DUT) and the number of vernier events that will be triggered. As noted above, the vernier event values provide a fine delay (less than one clock) following the final clock cycle of the event count (delay time defined by the sum of integral clock counts).

Within the context of the present invention, an event clock is a processing rate of the event data, and a master clock is a clock that the hardware uses to conduct its event processing. The repetition rate of the event clock can be the same as that of the master clock. As will be described later, the event clock can be created by multiplying a scaling factor with the master clock. In other words, the hardware components are processed by the rate of the master clock where the event timings are modified by the rate of the event clock.

In FIG. 7, the event count delay logic 34 includes an event count state machine (ECS) 41 and a 27-bit event counter 42, which is basically the same as that shown in FIG. 5. Throughout the description of the present invention, all clock inputs use the master clock unless otherwise specified. The event count state machine 41 is a master controller for an overall operation of the event pipeline and summing logic (EVP) 33 in FIG. 3. Namely, the event count state machine 41 operates as a master controller of the event pipeline and summing logic 33, and determines the number of event clock delays between vernier events.

The event count state machine (ECS) 41 controls the operation of both the event counter 42 and an event vernier pipeline (ex. vernier data decompression 35 and event vernier summing 36 of FIG. 3). The preferred embodiment of the present invention incorporates the compression method similar to the example shown in FIG. 6C as will be described later. Thus, the event count state machine 41 controls the process of loading the event count data into the event counter 42. Specifically, the event count state machine 41 provides the following functions:

(1) Loading of the event data to the event counter 42 based on the state of "start" and "continue" signals which are defined in Table 1.

TABLE 1

| Start | Continue | Operation |
| --- | --- | --- |
| 0 | 0 | Return to Idle. |
| 0 | 1 | Return to Idle. |
| 1 | 0 | Begin processing and Initialize EVP. |
| 1 | 1 | Continue processing without initializing EVP. |

(2) Handshaking with an event vernier state machine (FIG. 14) in the event vernier summing logic 36 and an event scaling state machine (not shown) in the event scaling logic 37 shown in the event pipeline and summing logic 33 of FIG. 3.

(3) Generating an event trigger signal that acts as an master enable for the vernier data. As will be described in detail later, the event trigger signal is produced by summing the event count data while incorporating an additional delay when there is a carry over as a result of event vernier summing or event vernier scaling.

(4) Generating pipeline control signals to increment the vernier pipelines at the end of each event count.

(5) Fully controlling the event count RAM's address counters (address controller 18) at all times during either the start or continue operation.

(6) Generation of the status signal "Busy" that is true during normal operations. The busy signal stays true until the last data value has been flushed from the EVP (event pipeline and summing logic 33) pipeline at the end of data processing. The event count state machine provides means to send a signal to the event based test system to inform that the EVP pipeline is flushed. This operation does not require a specific state of the event count state machine 41.

Figure 14:
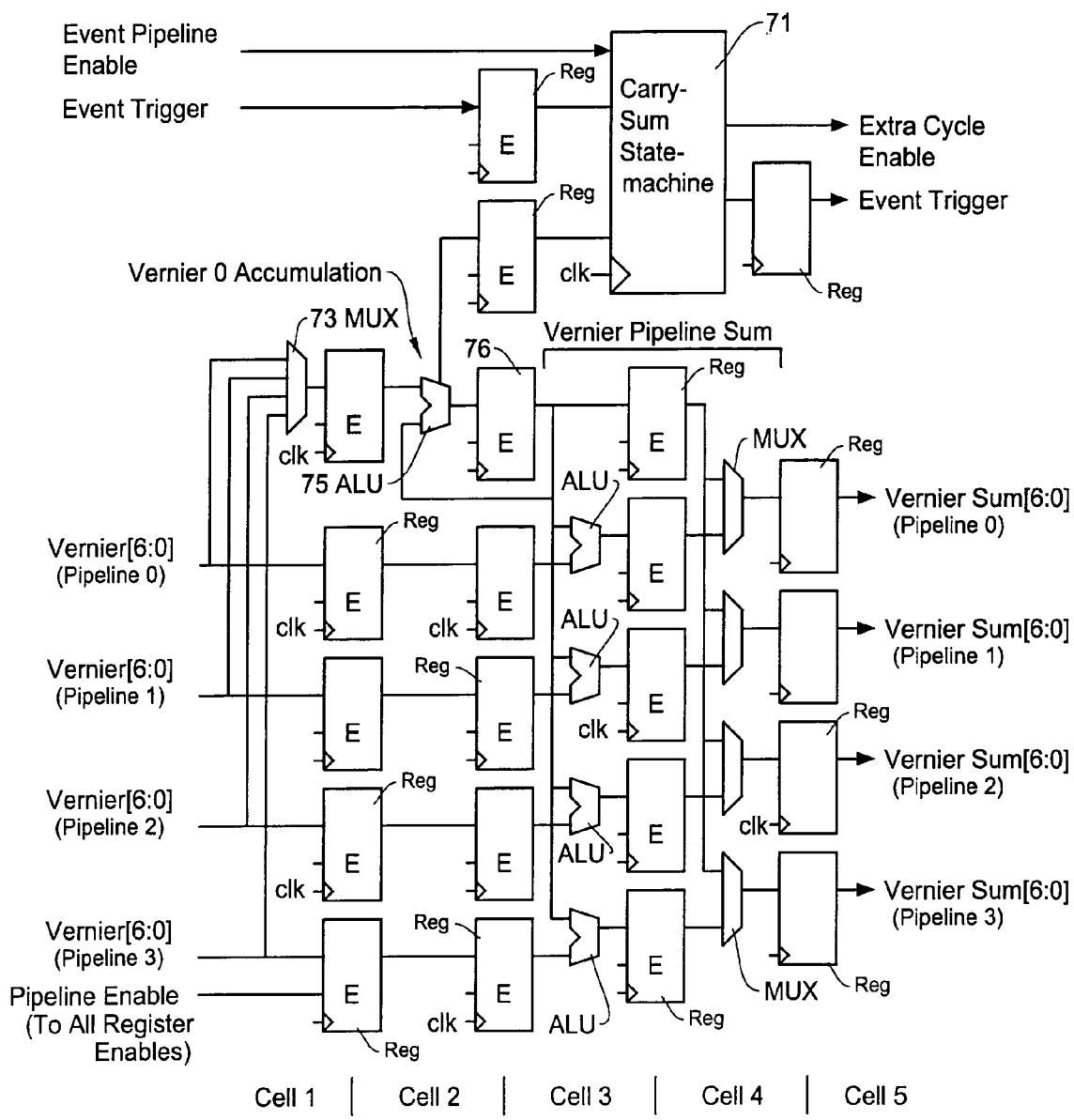
FIG. 14 is a block diagram showing an example of structure in the event vernier summing logic of FIG. 3 for accumulating the vernier data of the series of events through the parallel pipelines.
Figure 16:
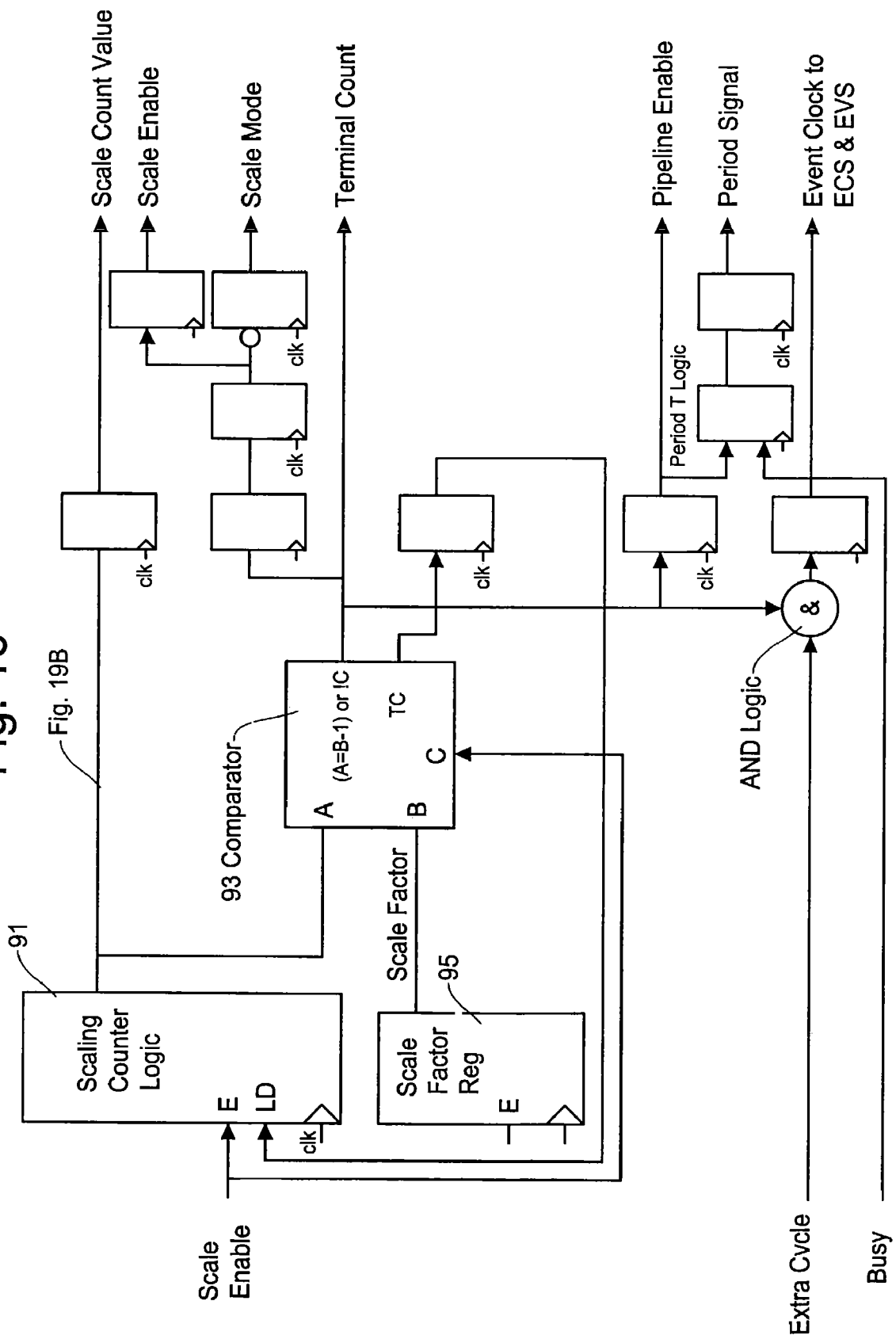
FIG. 16 is a block diagram showing a basic architecture of the event scaling logic in the present invention for scaling the event count data from the event count delay logic of FIG. 7.
Figure 17:
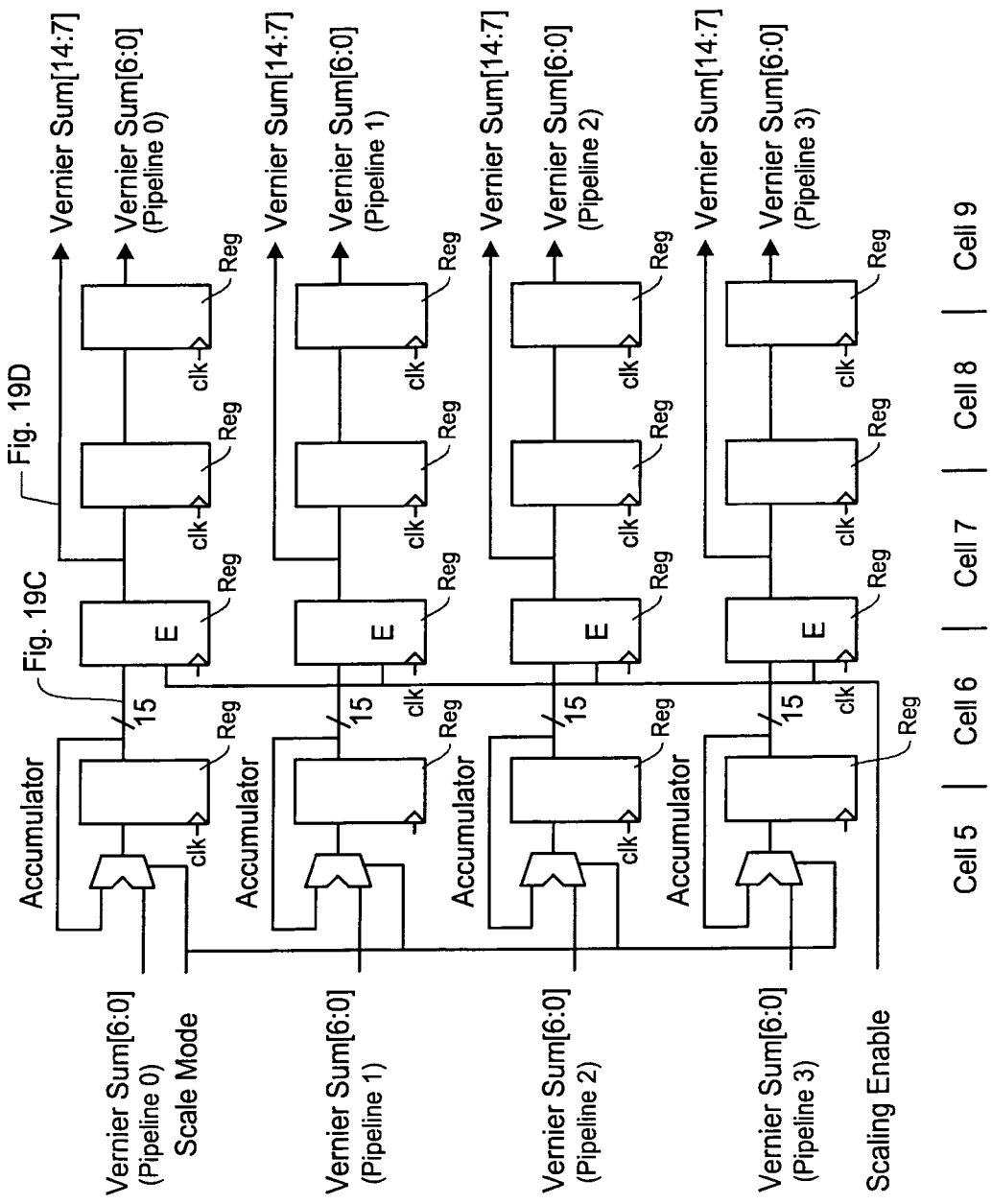
FIG. 17 is a block diagram showing an example of structure of the event vernier scaling logic in the present invention for scaling the event vernier data from the event vernier summing logic of FIG. 14.
Figure 18:
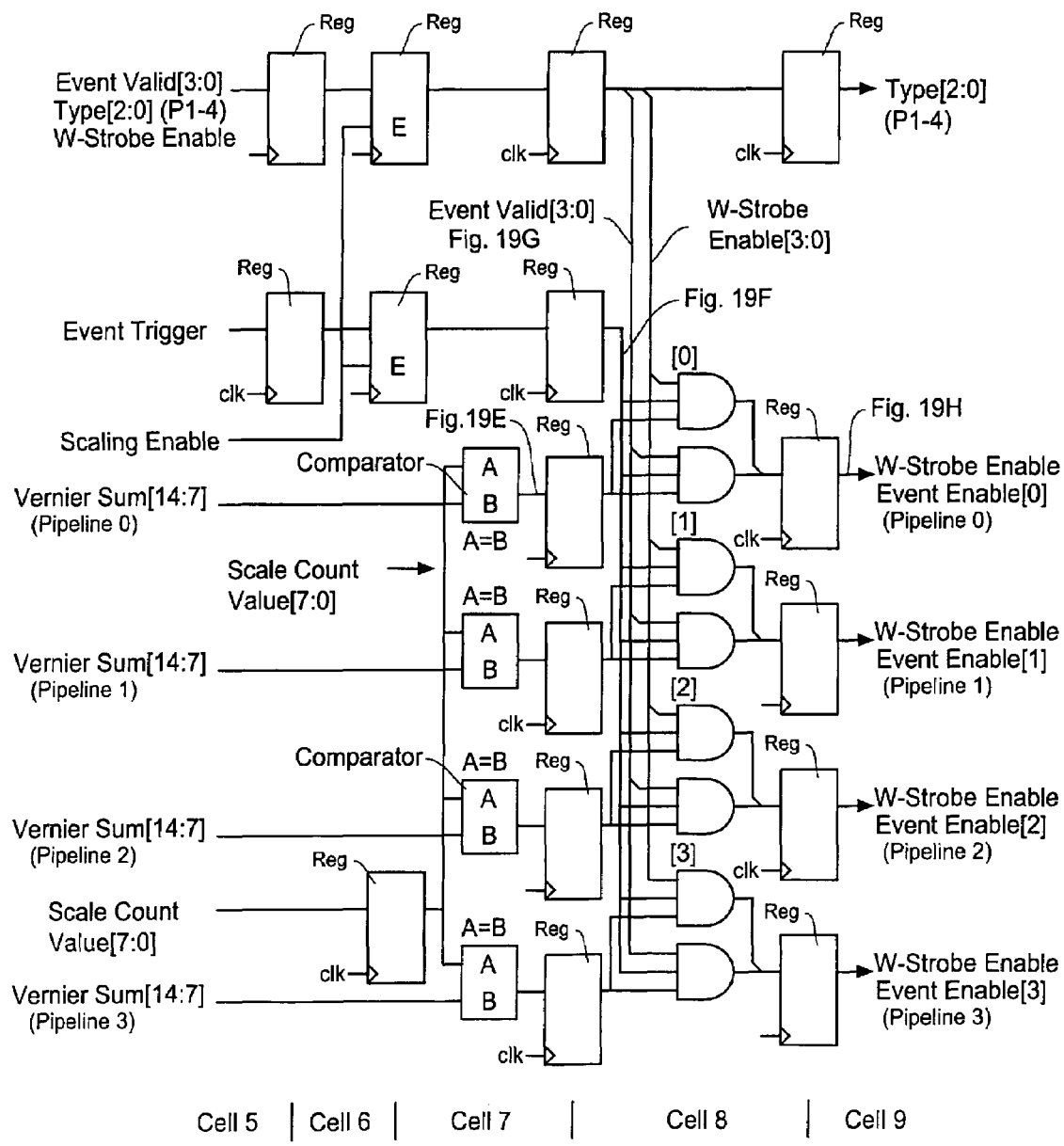
FIG. 18 is a block diagram showing an example of structure in the event vernier scaling logic in the present invention for final compare of the scale count value from the event scaling logic of FIG. 16.

The event count state machine 41 uses handshaking with other state machines in the event pipeline and summing logic 33 in two ways. The first is to simply signal the start of a new event count. This operation is primarily confined to the event vernier state machine (FIG. 14). The second type of handshaking causes the state machine to insert wait states into its processing cycle. This operation occurs between the event count state machine 41 and the event scaling logic (FIGS. 16–18).

Figure 8:
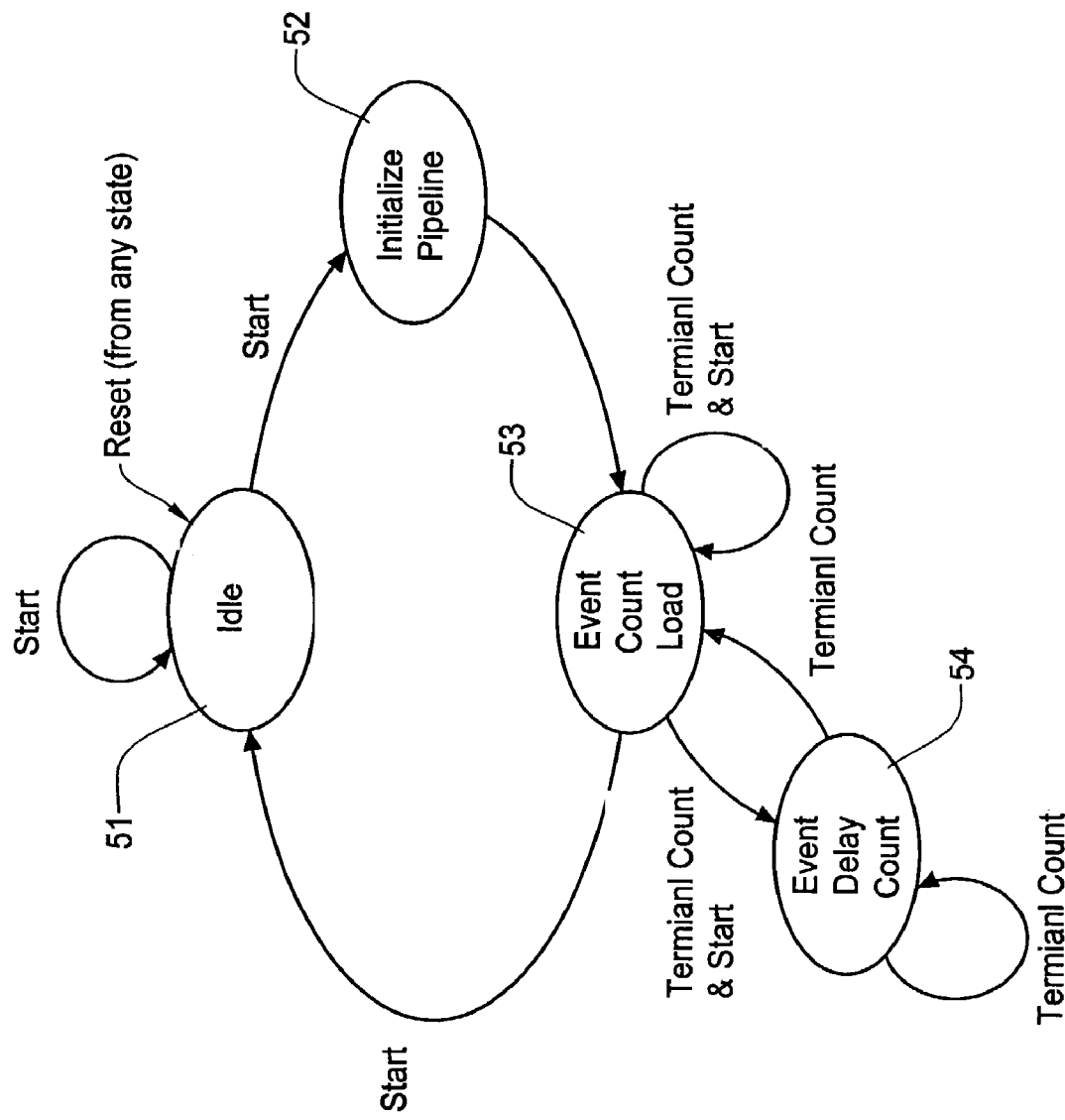
FIG. 8 is a state diagram showing an example of operation of the event count state machine in the event count delay logic of FIG. 7.

FIG. 8 is a state diagram showing a basic flow of operation of the event count state machine 41. The states in the diagram are defined as follows:

The "Idle" state 51 holds the current state of the event pipeline and summing logic (EVP) 33 between each data processing session. The next processing session may begin as either the start of processing or a continuation of processing.

The "Initialize Pipeline" state 52 initializes the EVP pipelines in preparation for the next valid piece of data. The initialization depends on the operation required. Thus, the initialization may require the entire EVP pipelines to be re-initialized or it may simply require that the pipelines resume previous data processing. The signals "start" and "continue" determine the operation required.

The "Event Count Load" state 53 loads the event delay counter 42 based on the data from the event count memory 20. The loading operation may consists of 1 to 4 bytes of event count data (FIG. 9). A load of an event count of either 0 or 1 requires the event count state machine 41 to perform another load operation during the next event clock cycle. This will continue until the event count becomes greater than 1 (bit[7] in FIG. 9).

The "Event Delay Count" state 54 provides the means to add delay to each event based on the terminal count signals from the event counter 42.

Although the state diagram does not show the pipeline enable (FIG. 7) from the event scaling logic, this signal acts as a pipeline clock enable to the event count state machine 41. The pipeline enable from the event count scaling logic 37 converts the operation of the event count state machine 41 from being based on the master clock cycles to being based on the event clock cycles. In other words, the pipeline enable has a repetition rate of the event clock.

Referring back to the block diagram of FIG. 7, in the preferred embodiment, the event counter 42 consists of a 27 bit down counter. The event count state machine (ECS) 41 loads the counter based upon the formats of delay data stored in the event count memory 20. As noted above with reference to FIGS. 6A–6C, for effectively using the event memory, it is preferable to describe each event data by one or more small words.

Such an example is shown in FIGS. 9–11. In the example of FIGS. 7 and 9–11, the event count data possibly have four types of formats: single word, double words, triple words and quad words, i.e., up to 4 words. Thus, in the case where a particular event count data is configured by triple words, a data loading operation of 8 bits (one word) from the event count memory 20 to the event counter 42 will be repeated three times.

FIG. 9 shows an example of data structure in the event count memory 20 in the present invention. In this example, an 8-bit word is configured by 5-bit count data COUNT[4:0], 2-bit vernier number data EVCNT[6:5] and a 1-bit flag[7]. The COUNT data shows a number of clock cycle to delay for a particular event, i.e., integral part of the event data. The EVCNT data shows a number of vernier events in the processing cycle. Because of the compression method shown in FIGS. 6C and 9–11, it is necessary to know as to how many pieces of vernier data in the particular address of the event memory for a particular event. The EVCNT data shows such information. The flag[7] is to distinguish the types of event count data by indicating whether there is a remaining word (flag 0) or it is the last word (flag 1).

For loading the event count data of FIG. 9 to the event counter 42, the address controller 18 (FIG. 3) provides the address to the event count memory 20. The event count state machine 41 issues an address increment signal to the address controller 18 to increment to the next address following each load of the event count data. The event count data is assumed to have been reduced by the number of load operations required. For single byte count values, no reduction is necessary because this operation does not require the event counter 42 to pause between counts. For two or more byte counts, each additional byte requires the counter to wait for one additional event clock cycle. For example, a quad word load of event count data implies that the entire value has been reduced by three event clock count cycles by software prior to being loaded into the event count memory 20. For all count cycles, the unused bits of the event counter 42 will be forced to zero during the first data load cycle.

The event vernier data decompression logic 35 in FIG. 3 is described in more detail with reference to FIGS. 10–11 and 12A–12B. The event vernier data decompression logic 35 performs the function of decompressing the vernier data stored in the event vernier memory 21. For effective use of the memory capacity, the compression technology similar to that shown in FIG. 6C is used in the preferred embodiment. Namely, the event vernier data is divided into one or more relatively small bits of data so that each event may have from 1 to 4 vernier delays (first to fourth vernier data). Each vernier data has a vernier delay data (7 bits) and one event type data (3 bits) The event count memory 20 provides the number of vernier delays in each event clock cycle as the event count parameter EVCNT[1:0] as shown in FIG. 9.

The vernier data is sequentially stored in the event vernier memory 21 in the manner shown in FIG. 6C and FIG. 10. Namely, each address of the event vernier memory stores four words of vernier data. In the present invention, such vernier data are processed through four pipelines in a parallel fashion as will be described later. Thus, in the event vernier memory of FIG. 10, the event vernier data is sequentially stored for respective pipelines starting at a vernier pipeline 0, and continuing to vernier pipelines 1, 2, and 3.

In the example of FIG. 10, Event 0 has three vernier delays (Vernier 0–2) and Event 1 has four vernier delays (Vernier 0–3) while Event 2 has one vernier delay (Vernier 0). FIG. 10 shows that one or more vernier delays may cross the memory address boundaries. For example, Vernier 0 of Event 1 is in the address 0 while other Verniers 1–3 of Event 1 are in the address 1 of the event vernier memory. However, each event count delay may only require a one-clock cycle delay. Thus, the event vernier data decompression logic 35 (FIGS. 12A–12B) must pre-fetch the vernier data from at least two memory addresses of the event memory in order to insure that all vernier data is available for each event during each master clock cycle. FIG. 10 also demonstrates that two or more events may use one vernier address. For example, event data for Event 3, Event 4 and Event 5 are stored in the address 2 of the vernier memory. This means that the address pointer of the event count memory 20 will have no relationship to the address pointer of the event vernier memory 21, i.e., independent from one another.

FIG. 11 shows the relationship between the event data and the event vernier data for each event. For simplicity, this example assumes that the event count memory is loaded with single byte of event count data. As noted above, EVCNT indicates a number of vernier data involved in each event. ECR address indicates the addresses of the event count memory (event count RAM) and EVR address indicates the addresses of the event vernier memory (event vernier RAM). The vernier data are allocated to vernier pipelines 0–3.

In FIG. 11, the valid vernier pipeline data are listed for each event as defined in the event vernier data format of FIG. 10. In this example, Event 1 and Event 5 show how event vernier data may cross the addresses of the event vernier memory. Similarly, the addresses of the event count memory closely correspond to the event number, where as, every address of the event vernier memory contains vernier data for multiple events.

Figure 12A:
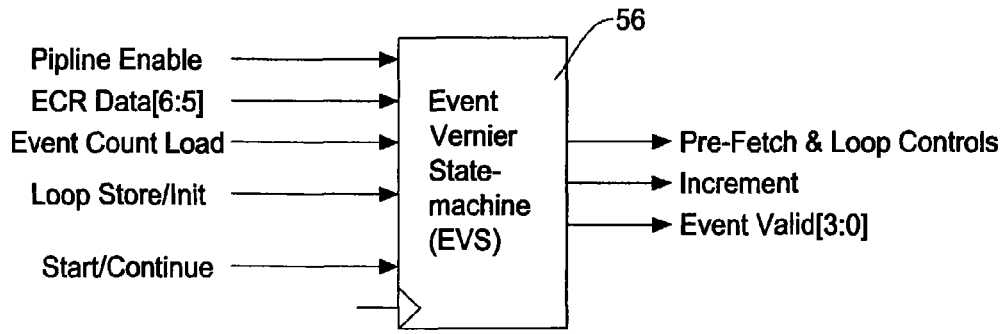
Figure 12B:
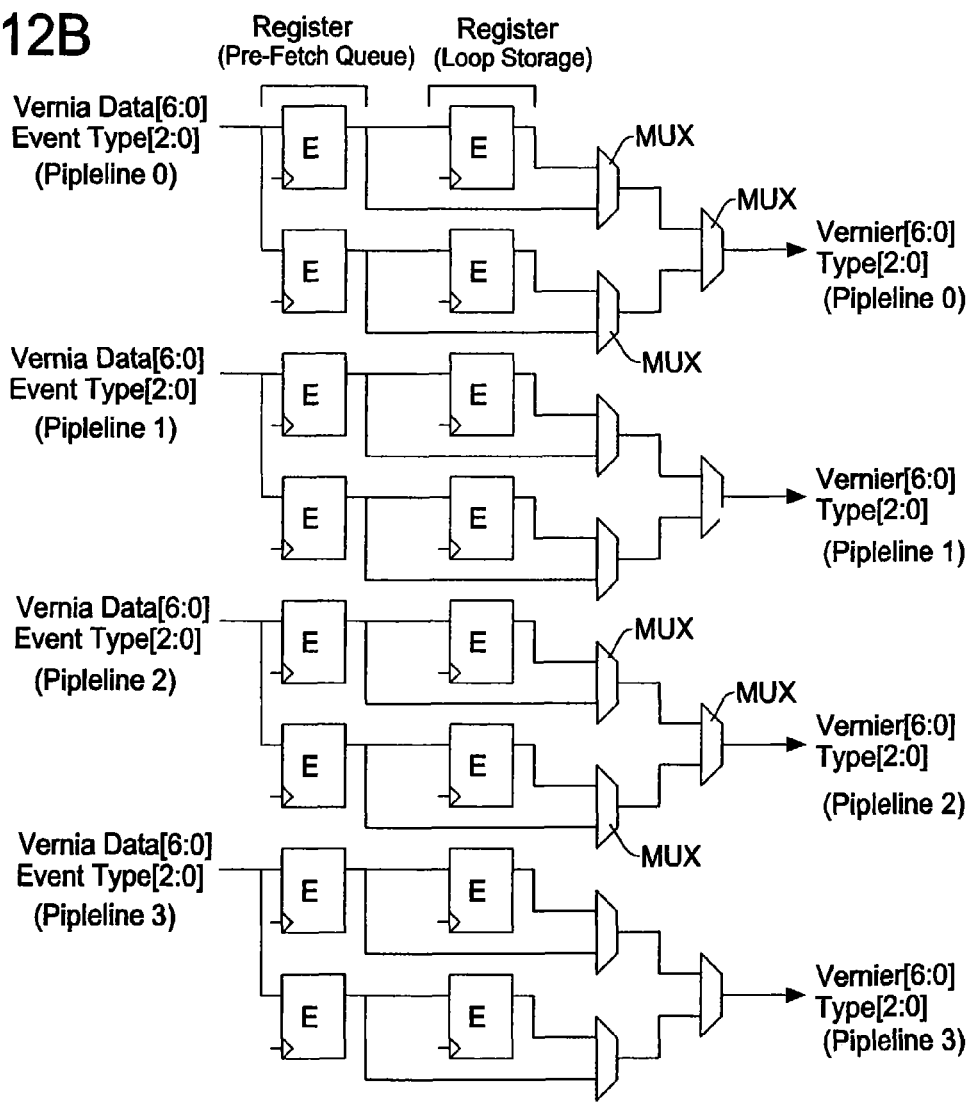

FIGS. 12A–12B illustrate the basic architecture of the event vernier data decompression logic 35. The event vernier data decompression logic 35 is comprised of an event vernier data compression state machine 56, two banks of pre-fetch queue registers and two banks of loop storage registers. The event vernier data compression state machine 56 in FIG. 12A controls an overall operation of the event vernier decompression. FIG. 12B shows that four vernier data can be provided to the corresponding pipelines 0–3 in parallel where the vernier pre-fetch registers fetch the event vernier data based on the vernier number data EVCNT[1:0] from the event counter memory 20. In this example, each vernier data bus provides seven bits of vernier delay data and three bits of event type data. As noted above, since the four pipelines are configured in this logic, the pre-fetch queue registers and loop storage registers are divided into four to the corresponding pipelines.

As noted above, there are times when the vernier data for each event are required to retrieve from two separate memory addresses. It is not physically possible to retrieve data from two separate addresses simultaneously when using a single port RAM. Therefore, a pre-fetch must be performed that retrieves the contents of two addresses during initialization. Thus, when a multiport RAM is used as an event vernier memory, the pre-fetch queue registers may not be necessary. When looping, the loop registers are used to restore the state of the pre-fetch registers. Such a restoration process is a requirement for the proper operation of the decompression logic.

In the event vernier data decompression logic 35, the event vernier data decompression state machine 56 is responsible for maintaining an event pointer that tracks vernier 0 for each event. As shown in FIGS. 10–11, vernier 0 represents the base vernier for each event. The event vernier data decompression state machine 56 is responsible for handshaking with the event count state machine 41 (FIG. 7) to determine the start of each new event count. The event vernier data decompression state machine 56 generates the necessary enables to mark all valid vernier pipelines, and fully controls the event vernier address counters at all times during either "start" or "continue" operation.

The event vernier data decompression state machine 56 is also responsible for saving the state of both the event pointer and each vernier pipeline prior to any loop operation. This is due to the compression of the vernier data as shown in FIGS. 10 and 11. The loop control signals are defined as shown in Table 2.

TABLE 2

| LOOP_STORE | LOOP_INIT | Operation |
| --- | --- | --- |
| 0 | 0 | Normal processing |
| 0 | 1 | Restore the event pointer and pipeline data |
| 1 | 0 | Store the event pointer and pipeline data |
| 1 | 1 | Invalid |

In the loop operation, it should be noted that the longest vernier value (of the vernier 1, 2, or 3) from each event must be separated from the next vernier 0 by at least one event clock during loop operations. This is not a requirement for non-looping operations.

The event vernier pre-fetch queue registers consists of two banks of registers as noted above. Each bank can store up to four event vernier data consisting of 10 bits each (7 bits of vernier data and 3 bits of event type data). The loop storage registers provide storage equal in size to the pre-fetch resisters. The vernier data decompression state machine 56 provides the controls to load or select each of these register sets.

Figure 13:
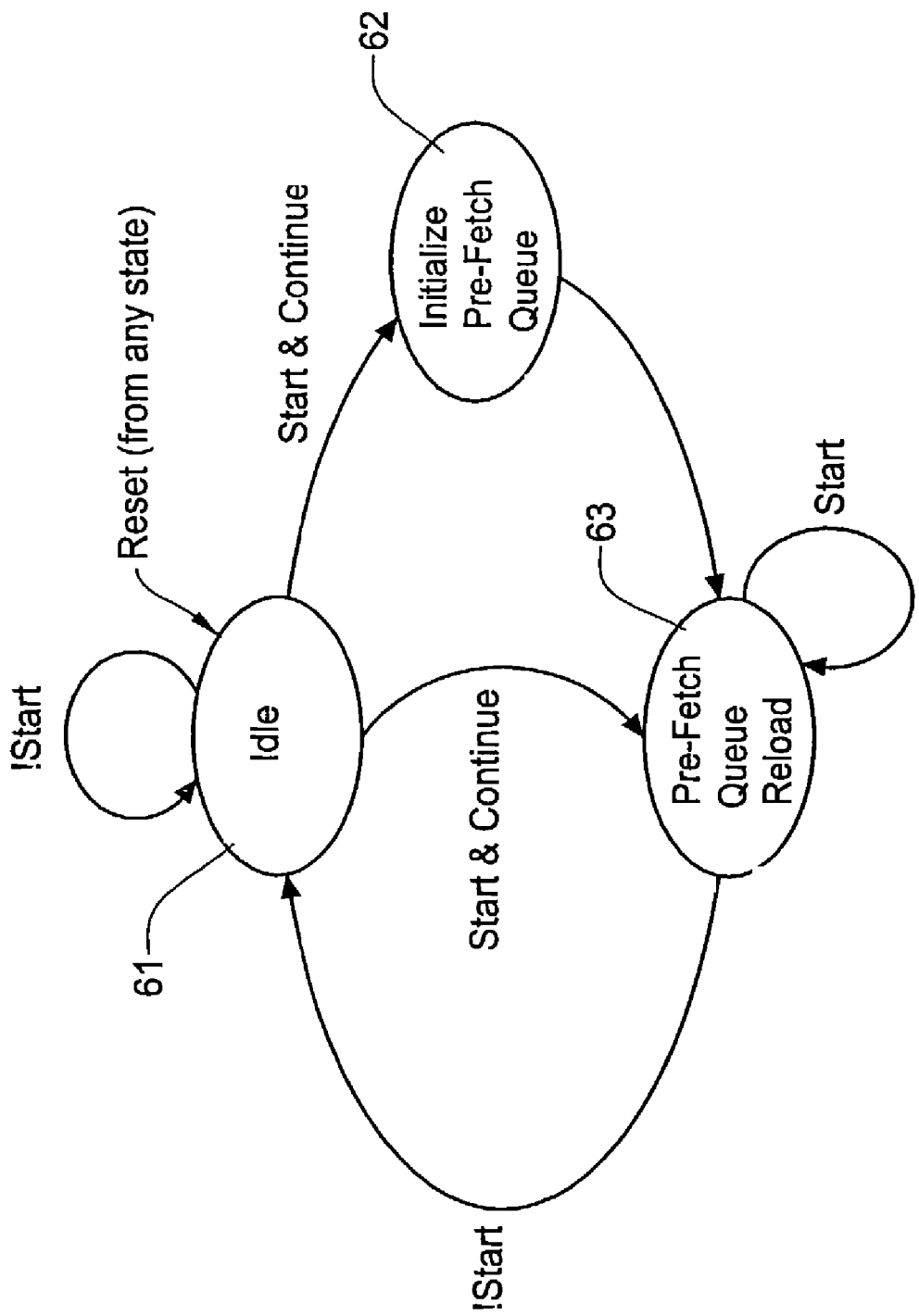
FIG. 13 is a state diagram showing an example of basic operation of the event vernier data decompression state machine incorporated in the event vernier data decompression logic of FIGS. 12A–12B.

FIG. 13 is a state diagram showing the basic flow of operations of the event vernier data decompression state machine 35. The states in the diagram are defined as follows:

The "Idle" state 61 holds the current state of the pre-fetch queue controls between each data processing session. The next processing session may begin as either the start of processing or a continuation of processing.

The "Initialize Pre-Fetch Queue" state 62 initializes the event vernier pre-fetch queue in preparation for the next valid piece of data. This initialization may require the entire pre-fetch queue registers to be re-initialized or it may simply require that the queue resume the previous data processing. The signals "start" and "continue" determine the operation required.

The "Pre-Fetch Queue Reload" state 63 loads the event vernier pre-fetch register banks based on the EVCNT[1:0] data from the event count memory 20 indicating the number of vernier delays involved in the particular event. More specifically, the pre-fetch queue register acts as a ping-pong buffer where the banks are alternately reloaded. Storage and retrieval of data for loop operations may also be performed in this state. Loop data retrieval occurs when the LOOP_INT signal (Table 2) has been asserted, and consists of enabling a series of select bits until the pre-fetch queue bank(s) are reloaded from the event vernier memory 21. Similarly, the vernier pipeline pointer is automatically restored during the assertion of the LOOP_INT signal. The loop operations do not require a separate state.

The event vernier summing logic 36 in FIG. 3 is described in detail with reference to FIG. 14. The event vernier summation logic 36 is responsible for correctly determining the vernier delays within a clock cycle. The event vernier summation is condensed to calculating the fractional delays within an event cycle as represented by the event vernier data from the event vernier memory 21. As shown in FIGS. 10 and 11, there are two types of vernier delay possible since the preferred embodiments incorporates the compression technology. The first is vernier 0 delay value ($\Delta V_{n0}$) where "n" indicates a n-th event. The vernier 0 delay provides the base delay of each event within a clock cycle. The remaining vernier delay values ($\Delta V_{n1}, \Delta V_{n2}, \Delta V_{n3}$) are added to this base value for each event. Thus, an overall vernier delay for each event is the sum of the vernier 0 value and the remaining vernier delay values. For example, for Event 1, an overall vernier delay $\Delta V_1$ is composed of the sum of a vernier 0 delay $\Delta V_{10}$, and remaining vernier delays $\Delta V_{n1}$, $\Delta V_{n2}$, and $\Delta V_{n3}$. It should be noted that the event vernier summing logic 36 is to obtain a sum of all of the vernier delays of all of the previous events and the current event.

FIG. 14 shows the basic architecture of the event vernier summing logic 36. All clock inputs use the master clock unless otherwise specified. The event vernier summing logic 36 consists of a vernier 0 accumulation logic, a vernier carry-sum state machine, and a vernier pipeline sum logic. The vernier pipeline sum logic includes pipelines 0–3 where each pipeline is configured by a plurality (ex. Cells 1–5) of registers "Reg" series connected with one another. The vernier 0 accumulation logic includes an accumulator consisting of an ALU (arithmetic logic unit) 75 and a register 76 for accumulation of each vernier 0 delay through a multiplexer (MUX) 73 of each event. In this example, only the lower 6 bits of the accumulation are maintained.

When a carry is detected during the accumulation, the carry-sum state machine 71 must determine when to insert an additional clock cycle. This means that an extra cycle must be added to the event count sum when the accumulated event vernier exceeds one cycle of the clock. The carry-sum state machine 71 handshakes with a scaling counter logic 91 in FIG. 16 to insert one wait state into its current event count cycle. This has the effect of adding one additional event clock of delay between the current event and the next event. The only exception to adding one clock for each carry detected occurs when the event has a zero event count delay. A carry is meaningless under this condition since a clock cycle is already inserted between the zero event count delay and the next event.

The final operation performed by the event vernier summing logic 36 is to add the accumulated vernier 0 delay ($\Delta V_{0\ sum}$) to each of the remaining vernier delays ($\Delta V_{n1}$, $\Delta V_{n2}$ and $\Delta V_{n3}$). The event vernier summing logic 36 includes four pipelines 0–3 each having an arithmetic logic unit (ALU) for adding the accumulated vernier 0 delay to the remaining vernier delays. This example shows that each pipeline has five cells (Cell 1–5), i.e., series connected registers through which the data is sequentially shifted by one cell at each master clock. The above noted process produces the final vernier delay (vernier sum data) for each vernier pipeline during non-scaling operations.

The event vernier summing logic of FIG. 14 performs no operation on the event type data of any of the vernier pipelines. Although not shown, the event type data is simply passed down the summation pipeline in order to maintain data alignment with the vernier data.

Figure 15:
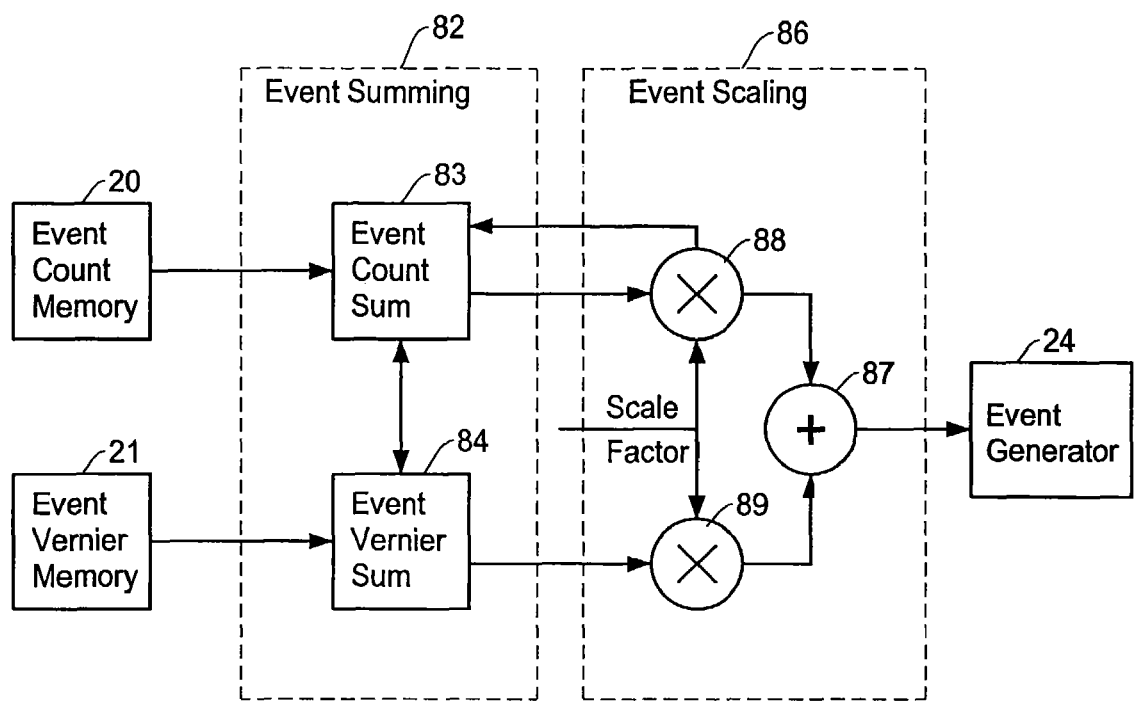
FIG. 15 is a schematic diagram showing a basic concept of the event scaling logic in the present invention for scaling the event count data and event vernier data.

The event scaling logic 37 in FIG. 3 is described in detail with reference to FIGS. 15–19. FIG. 15 is a simplified diagram showing the basic concept of the event scaling logic and the relationship with the event summing logic. An event summing logic 82 includes an event count summing 83 and an event vernier summing 84. The event count summing 83 corresponds to the event count delay 34 (FIG. 7) and the event vernier summing 84 corresponds to the event vernier summing 36 (FIG. 14). An event scaling logic 86 includes multipliers 88 and 89 to multiply the event count sum and event vernier sum by a scale factor. The scaled data is combined by an adder 87 is supplied to the event generator 24 (FIG. 3).

As noted above, the event scaling logic 37 provides the means to multiply the delay between events. In the preferred embodiment, the multiply factor is configured by 8 bits, which allows the delays between events to be scaled up to 256 times. As shown in FIG. 15, the scaling has two parts: the event count scaling (multiplier 88) and the event vernier scaling (multiplier 89). The event count scaling is to scale the accumulated event count data by a scaling factor and the event vernier scaling is to scale the accumulated event vernier data by the scaling factor.

FIG. 16 illustrates the basic architecture of the event count scaling logic. The event count scaling logic includes a scaling counter 91, a comparator 93, a scale factor register 95, and an AND logic. The scaling counter 91 is typically an up-counter for up-counting the number of master clock. The comparator 93 compares the output of the scaling counter 91 and the scaling factor from the register 95. In this example, the comparator 93 produces a terminal count signal when the count result A reaches less than one of the scaling factor B, i.e., A=B−1 or ≠C. The scale factor register 95 stores 8 bits of scaling factor as noted above. The AND logic produces an event clock (event pipeline enable) based on the terminal count signal from the comparator 93 and the extra cycle delay from the carry-sum state machine 71 in the event vernier summing logic (FIG. 14).

Basically, for scaling event data, the event count scaling logic of FIG. 16 produces an event clock which has a time period of the scale factor times of the master clock. For example, to increase the event timings by two times, the scale factor is two (2). In this case, the event count scaling logic of FIG. 16 produces an event clock having a time period two times of that of the master clock. The event clock is generated through the AND logic based on the terminal count signal from the comparator 93. The event clock is provided to the event count state machine 41 in the event count delay logic of FIG. 7, thereby producing the event trigger signal to the event vernier summing logic (FIG. 14) based on the event clock.

In other words, the terminal count signal from the comparator 93 is the product of comparing the current scale cycle count to the value of the scale factor less than one. This operation allows signals such as a pipeline enable signal to occur during the terminal count cycle of the scale counter logic. However, this produces an offset between the scale count value and the scale enable signal of one clock cycle. Therefore, the scale enable signal should be valid on the last counter's cycle. (m) and not the second to the last cycle (m−1).

The scale mode signal is simply the inverse of the scale enable signal. The scale mode signal loads the first value of the vernier accumulator logic for the next scaled event clock cycle. The accumulator logic is discussed in more detail later.

The block diagram of FIG. 16 shows no control connections from either the event count state machine or the event vernier state machine. The scale counter logic 91 is controlled by the scale enable signal which is a static bit held in a register in the address controller (AC) 18. This bit is set or reset before processing begins. Thus, all of the output signals are valid prior to the start of event data processing. The scale enable signal should be disabled when the scale factor register is updated. This prevents the scaling counter logic 91 from potentially incrementing through its full 256-count range before using the new scaling factor.

The event count scaling operation is entirely controlled by the scale counter logic 91 through the signals such as event pipeline enable, pipeline clock enable to the event count state machine (event clock), and pipeline clock enable to the event vernier state machine (event clock). These signals provide the pipeline clock enables that insure that no data operation will advance faster than at a scaled, event clock period.

The event count scaling logic consists of inserting wait states into the event count state machine 41 (FIG. 7) equivalent to the scaling factor. For example, a scaling factor of "2" means that each event clock cycle will now use two master clock cycles. A scaling factor of "3" means that each event clock cycle will now use three master clock cycles, etc. These wait states are generated by the scale counter logic (up-counter) 91 in FIG. 16. The scale counter logic 91 provides both the means to insert wait states and the means to give the vernier delay scaling logic a way to determine when each vernier delay is valid (ex. event trigger).

The event count scaling logic of FIG. 16 generates a period signal which is an event cycle signal. The period signal marks the beginning of each event clock cycle. For non-scaled operations, the event clock cycle equals the master clock cycle. The period signal is always asserted during valid processing cycles only (marked by the busy signal).

For scaled operations, each event clock cycle equals "k" master clocks where "k" is the scale (multiplication) factor (i.e. 1, 2, 3, etc.). The period signal is only asserted during the first master clock cycle of each event clock cycle. In the preferred embodiment, the event scaling logic issues two additional period pulses at the end of a processing sequence to flush the event generator pipeline.

FIGS. 17 and 18 show the basic architecture of the event vernier scaling logic. The vernier data are shifted through the pipelines 0–3 in the parallel fashion by the timing of the master clock. As shown in FIGS. 17 and 18, each of the pipeline 0–3 is configured by a plurality of series connected registers "Reg". FIG. 17 shows the vernier data accumulator used for adding the vernier data an integer number of times. On the other hand, FIG. 18 shows the final compare of the scale count from the scale counter logic 91 of FIG. 16 and the MSB's of the accumulator in FIG. 17. The pipeline enables used in the event count scaling logic are not used in the event vernier scaling logic which is simply a data flow-through. The output from previous portions of the event pipeline and summing logic 33 already enter this logic correctly delayed in time.

These block diagrams in FIGS. 16–18 show that the scaling count value data has one fewer delays than the scale enable signal. The removal of the extra delay aligns the beginning of the scale count to the first master clock cycle following the assertion of the scale enable signal.

As noted above, the event count scaling logic consists of inserting wait states into the event count state machine 41 equivalent to the scaling factor. The event vernier scaling logic of FIG. 17 multiplies each vernier sum value by the scaling factor. The simplest means to multiply the vernier delay value is to simply accumulate each delay value for the number of times indicated by the scale factor. For example, a scaling factor of "2" means that there will be two master clocks during each event clock. Thus, these two clocks allow each vernier delay value to be summed with itself (1+1=2). A scale factor of "3" means that each vernier delay value may be added two times (1+1+1=3), etc. To achieve this, each accumulate cycle consists of a load cycle where the delay value is simply passed. This is followed by an accumulate cycle where the delay value is added on each successive clock cycle (1+1+ . . . +1=K).

Thus, in the event vernier scaling logic of FIG. 17, the vernier sum data from the vernier summing logic of FIG. 14 is supplied to the corresponding pipelines. The first cell (Cell 5) of each pipeline is an accumulator consisting of an arithmetic logic unit and a register. To multiply the vernier sum data by a scale factor "k", each accumulator repeats the accumulation cycles by "k–1" times as noted above. The scaled vernier sum data are shifted out from the pipelines (Cell 9).

The scaled vernier sum delay values will never be greater than the event clock length. However, the scaling operation may result in the vernier delay values spanning several master clock cycles. The maximum additional delay is 8 bits or 256 possible additional master clock cycles. To correctly determine the valid master clock cycle, the MSB's of the vernier delay sum must be compared to the master clock cycle number in each scaled event clock. This is done by each comparator in FIG. 18 where the output of the comparator shows the result of comparing the MSB's of the final vernier scale value (Vernier Sum[14:7] to the scale count value from the event scaling logic of FIG. 16. The event count scaling logic of FIG. 16 generates this cycle number and passes the values, correctly pipeline aligned, to the vernier scaling logic of FIGS. 17 and 18.

FIGS. 19A–19H illustrate these concepts for a scaling operation when the scale factor is "3". FIG. 19A shows the master clock which is the primary clock to the event pipeline and summing logic 33 of the present invention. FIG. 19B shows a scale count value which is an output signal of the scaling counter logic 91 in FIG. 16 as the pipeline aligned count. In the preferred embodiment, since the scaling counter 91 is an up-counter, the scale count value increases at each master clock. FIG. 19C shows an output of the vernier scale accumulator in FIG. 17. As noted above, the vernier multiply operation is performed by the accumulator where the multiply operation simply consists of loading the vernier data followed by multiple addition. Thus, for the scale factor "3", the vernier data $V_n$, for example, is added two times to create the scaled vernier data $3V_n$.

FIG. 19D shows the final vernier scaled value which is the final result of the vernier multiply operation (Vernier Sum [14:7] in FIG. 17). This result is only updated at the end of each scaled clock period. The final value must be stable prior to the scale cycle comparison operation. FIG. 19E shows an output of the comparator in FIG. 18 which is the result of comparing the MSB's of the final vernier scale value (Vernier Sum[14:7]) to the scale count value from the event scaling logic of FIG. 16. The scaled vernier data determines the master clock cycle where the compare becomes valid. It can occur in any of the three master clock cycles that form a single, scaled event clock cycle.

FIG. 19F shows the event trigger which marks the event clock cycle where the vernier data is valid. The event trigger signal is generated by the event count state machine 41 in FIG. 7. The event trigger signal is continuously high because the diagram has been condensed to show only the final cycle of each event. A longer diagram would show this signal is unasserted until the final event clock cycle of each event. FIG. 19G shows the event valid signal which marks a particular vernier pipeline (pipelines 0–3) as having valid vernier data. This signal is asserted for the entire event period (including both the event count and the vernier delay) that vernier pipeline contains valid data.

FIG. 19H shows the event enable signal which marks the event clock cycle where the vernier sum data is valid for the event generator 24 to use. This signal is generated by the combination of the scale cycle compare signal (FIG. 19E), the scale enable signal (FIG. 16), and the event valid signal (FIG. 19G). Thus, the event generator 24 (FIG. 3) generates an event by adding a delay time to the event enable signal of FIG. 19H where the delay time is scaled vernier sum data from the event vernier scaling logic shown in FIG. 17.

The window strobe logic 38 in FIG. 3 is described in detail with reference to FIGS. 20–23. Ordinarily, a strobe is a timing signal for sampling an output of the device under test, thus having no pulse width. Unlike such an ordinary strobe, a window strobe is a strobe signal having a wide pulse width (window). A window strobe is useful for detecting an foreseeable signal change such as a glitch in the output of the device under test.

Timing charts of FIGS. 20A–20D show an example of situation where a window strobe is used. FIG. 20A shows a clock such as a master clock or event clock in the foregoing examples. FIG. 20B shows a drive event (input stimulus) which is supplied to the device input pin. Suppose the device output pin shows a waveform as shown in FIG. 20C, the pulse P1 is sampled by a timing of a strobe event of FIG. 20D. However, for sampling glitch like waveforms P2 or P3 in the output, it is difficult to set the timing of the strobe. Thus, an event based test system of the present invention is designed to generate a window strobe of FIG. 20D to capture such glitches more easily and accurately.

Figure 21:
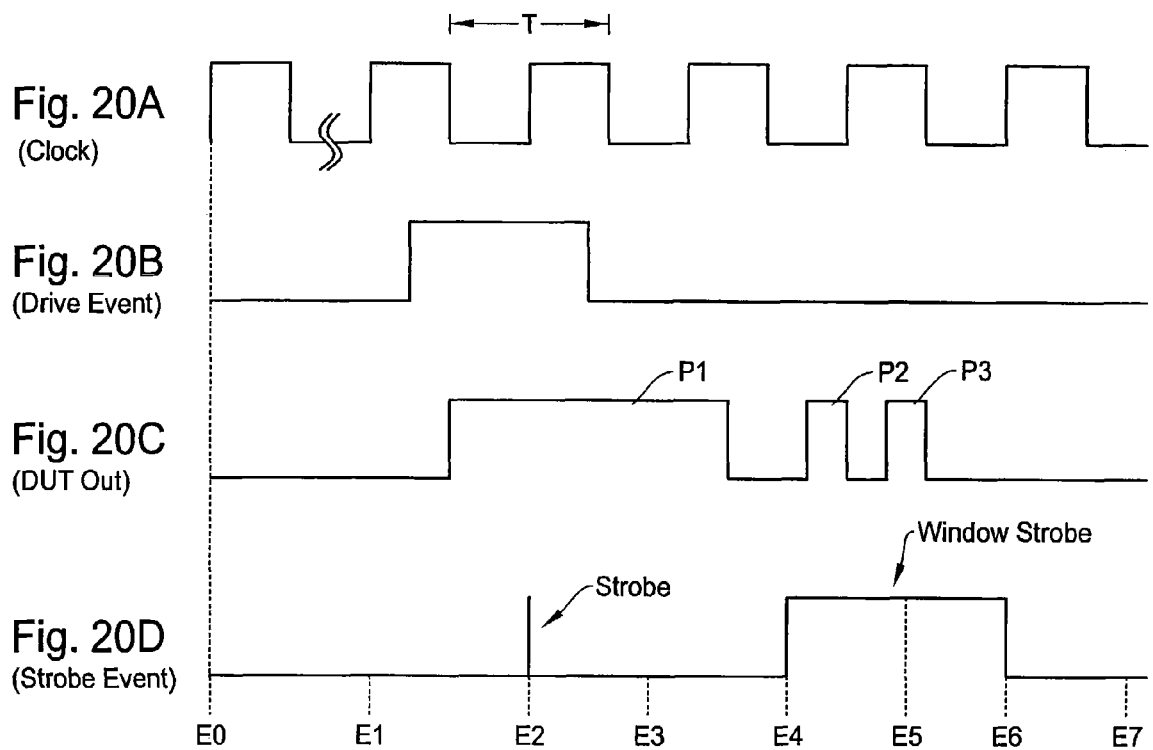
FIG. 21 is a schematic diagram showing an example of event data stored in the event memory for generating the window strobe of FIG. 20D.

An example of event data for generating the window strobe is shown in FIG. 21. The event numbers in the data table of FIG. 21 correspond to the event numbers shown in the waveform of FIG. 20D. It should be noted that, for simplicity, event type data is illustrated separately from the event vernier data, although the event type data may be included in the vernier data as in the above embodiments.

In this example, for generating the strobe (event E2), "Strobe" is written as an event type. Since it is unnecessary to define a pulse width of an ordinary strobe, the event generator 24 generates the strobe based on the event timing data and the event type data. For generating the window strobe, event type "Strobe" is specified for two or more continuous events. In FIG. 21, events E4 and E5 are assigned as "Strobe". The window strobe logic 38 monitors the event type data for two consecutive events and interprets that the window strobe is to be generated if there are two consecutive strobe events.

Figure 22:
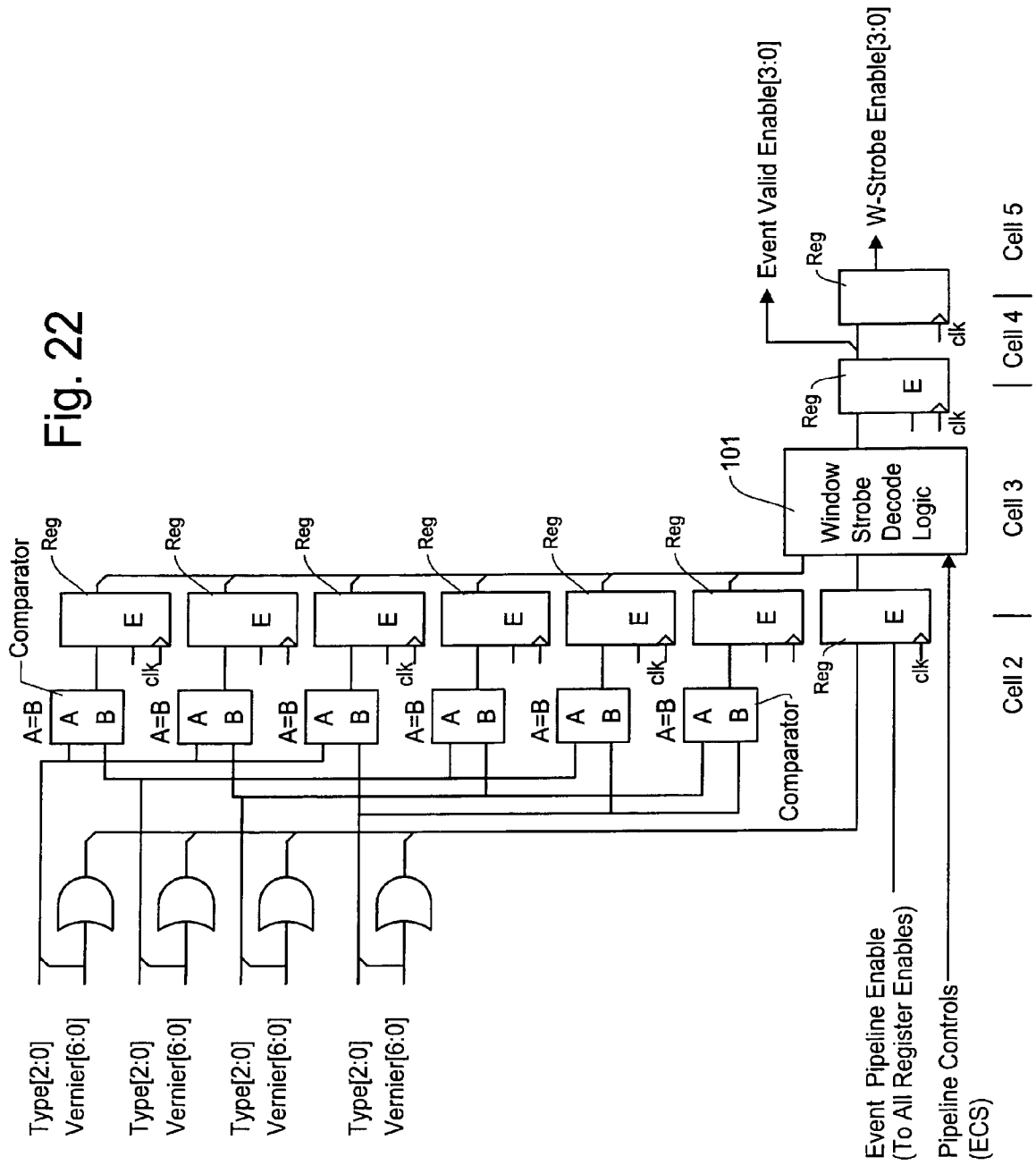
FIG. 22 is a block diagram showing an example of structure in the window strobe logic for detecting the event vernier data and event type data for generating the window strobe based on such data.
Figure 25:
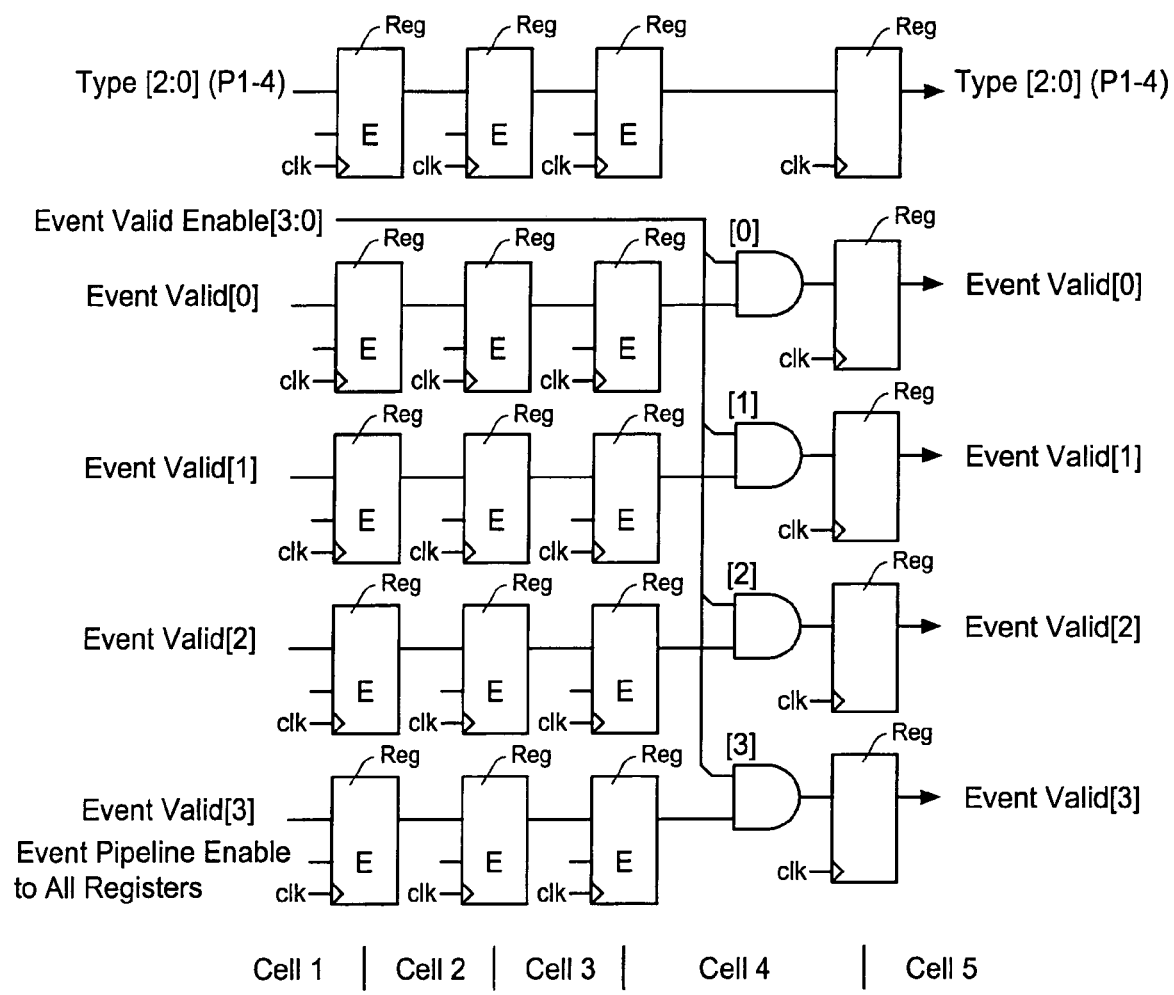
FIG. 25 is a block diagram showing an example of structure in a duplicate event removal logic for detecting a valid window strobe.
Figure 27A:
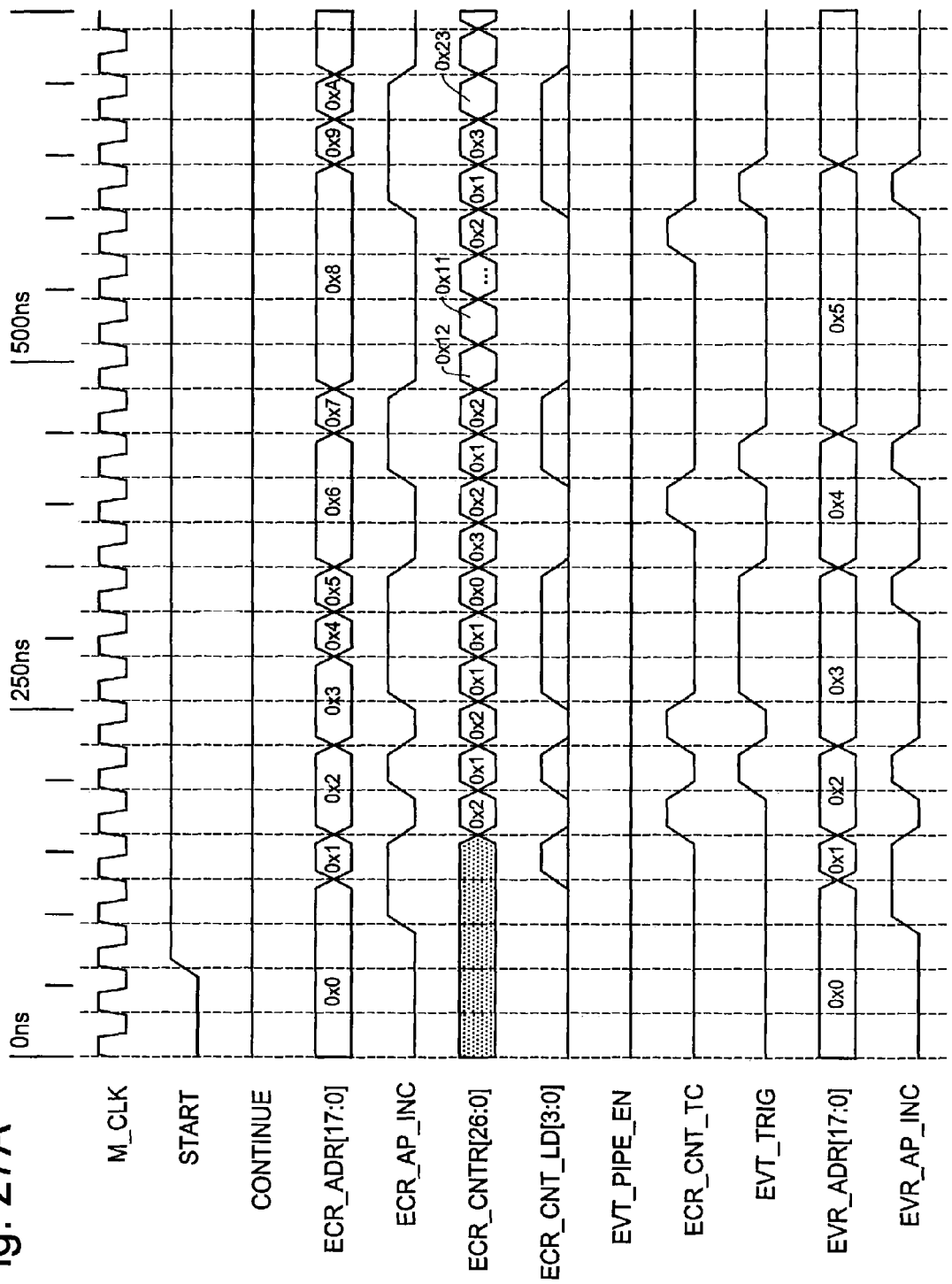
FIGS. 27A–27B are timing charts showing an example of operation of the event pipeline and vernier summing method and apparatus of the present invention when the scale factor is one (1).
Figure 27B:
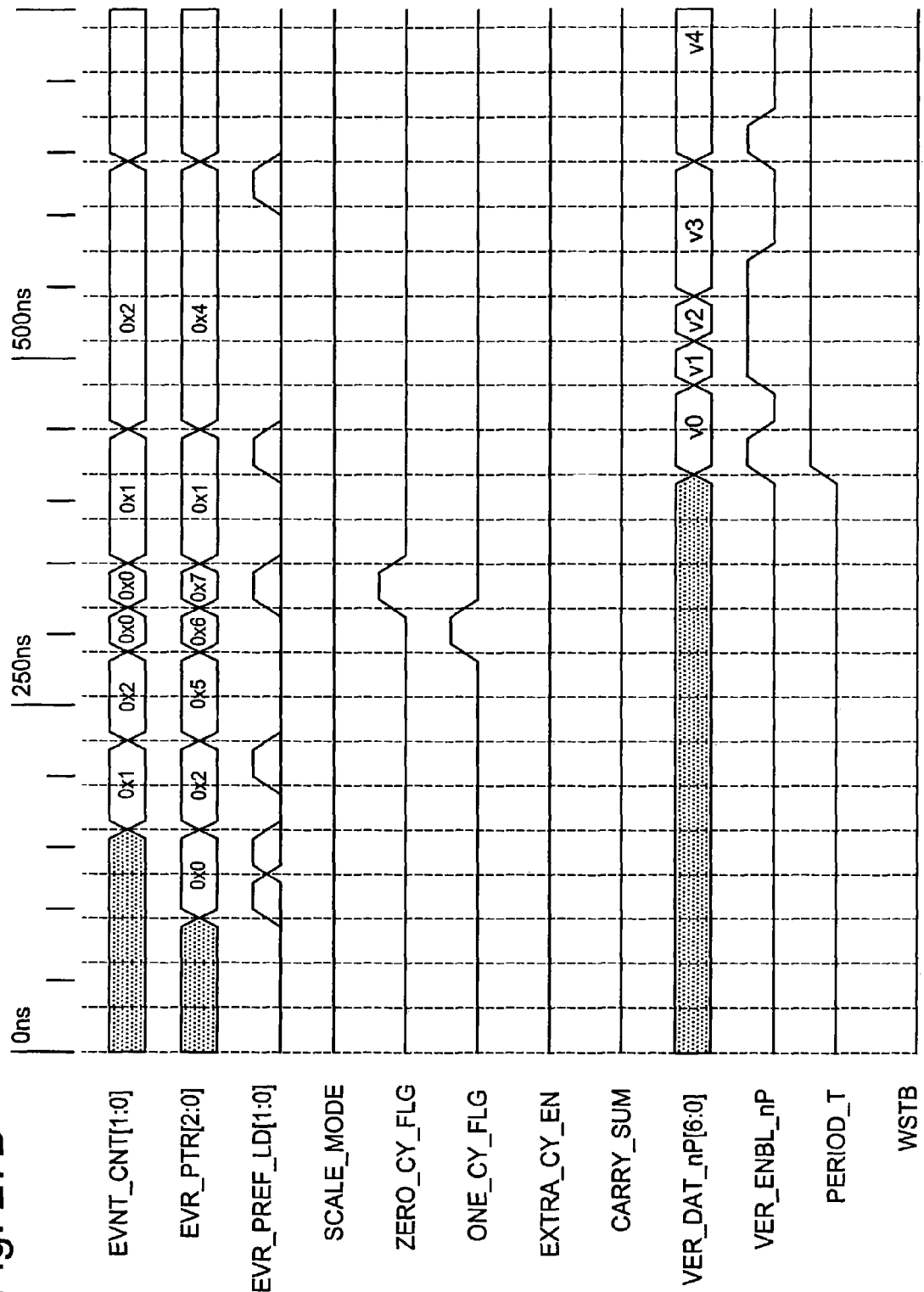

Namely, the window strobe logic 38 generates a window strobe output when two event vernier data (vernier delay and event type) match. FIG. 22 illustrates an example of basic architecture of the window strobe logic 38 in the preferred embodiment of the present invention. FIG. 25 illustrates an example of circuit diagram in the window strobe logic 38 for removing duplicate events. The window strobe logic 38 in FIGS. 22 and 25 has a pipeline structure similar to the foregoing examples where event type data and vernier delay data are shifted through the parallel pipelines by the timing of the master clock. As shown in FIGS. 22 and 25, each pipeline includes a plurality of series connected registers "Reg". This example shows the case where the window strobe is produced when both the vernier delay and event type of two events match with one another. When the window strobe is to be generated, the window strobe logic of FIG. 22 produces a window strobe enable which is sent to the scaling logic of FIG. 18 which performs the final output determination for the window strobe logic.

Table 3 shows these event types which produce valid window strobes.

TABLE 3

| Event Type | Valid Window Strobe | Description |
|---|---|---|
| 0 | No | No Event (Reserved) |
| 1 | No | Drive a One (H) to the DUT |
| 2 | No | Drive a Zero (L) to the DUT |
| 3 | No | No output to the DUT and don't care input by DUT |
| 4 | Yes | Test for a One (H) by DUT |
| 5 | Yes | Test for a Zero (L) by DUT |
| 6 | Yes | Test for High Impedance (Z) at DUT |
| 7 | No | No Event (Reserved) |

The window strobe logic of FIG. 22 receives event vernier data (vernier delay and event type signals) for each vernier pipeline directly from the event vernier state machine and event vernier pre-fetch queue shown in FIGS. 12A and 12B. Each data value is compared to all others. In the example of FIG. 22, the comparison operation is conducted to determine the following:

(1) If any two events match.
(2) If each has event type of 4, 5 or 6 (Table 3).
  (a) All other events are not valid window strobe events and are not considered.
(3) If event vernier is the base vernier (vernier 0).
  (a) This only applies to vernier 0.
  (b) The base vernier is identified by signals output by the event count state machine logic.
  (c) Check if the matching event type has a vernier=0.
(4) If the event vernier is not the base vernier.
  (a) These are verniers 1, 2, and 3.
  (b) The base vernier is identified by signals output by the event count state machine logic.
  (c) Check if both the event type and event verniers are equal.

It should be noted that, depending on the result of vernier compression, vernier 0 may reside in any of the four processing pipelines. Thus, the above rules require a series of comparisons. For event type, the following comparisons are performed:

(1) For Type 0
  (a) Is Type 0==Type 1
  (b) Is Type 0==Type 2
  (c) Is Type 0==Type 3
(2) For Type 1
  (a) Is Type 1==Type 2
  (b) Is Type 1==Type 3
(3) For Type 2
  (a) Is Type 2==Type 3

The above comparisons correspond to the six comparators in the window strobe logic of FIG. 22. This comparison rule is visualized by a table of FIG. 23A. The mark "X" represents a comparison between the two event types. A similar matrix may be constructed for the event vernier comparisons which is shown in FIG. 23B One of the objectives of the window strobe logic is to determine if any two events have the same type. The tables in FIGS. 23A and 23B show the possible comparisons available. In the example of FIG. 22, only the comparisons to Type 0 are of interest.

In addition, a window strobe is also defined as being detected when one of the event types that match to Type 0 has a corresponding vernier of zero. A logic "OR" of all of the vernier bits can determine if the vernier is zero (at the input of the logic of FIG. 22). In an "OR" operation, any input bit at t logic "1" will produce a logical "1" output. This would mark a non-zero vernier. Therefore, combining the three comparisons with the four zero determinations, the window strobe may be determined.

The table of FIG. 24A shows where a window strobe would be determined for vernier 0 where the mark "W" indicates a detected window strobe. The Types on the left hand column on the top have verniers equal to zero. The Types on the left hand column on the bottom have verniers that are not equal to zero.

The window strobe for verniers 1, 2, and 3 are determined in a similar way to the vernier 0 as shown in the table of FIG. 24B. The primary difference is that now a match between the vernier values must be made. For this determination, comparisons to Type 0 are ignored as are the determination of verniers with a value of zero. In each case, both the vernier and type must match and the Type must not be Type 0.

The window strobe logic 38 generates a one-clock pulse when the event type of vernier 0 matches event types of any other vernier pipelines, and the matching vernier pipeline's delay data has a value of 0. The window strobe logic 38 also generates a one-clock pulse when any two of verniers 1, 2, and 3 match on both the vernier delay and event type. In both of the cases above, one of the matching vernier pipelines is marked as not valid since no two vernier delay values may produce the same event type at exactly the same time.

Thus, such duplicate events are removed by the circuitry shown in FIG. 25. In this example, the removal operation is performed according to the rule listed in the table of FIG. 26. The rule for this operation is that one of the two events must be removed. This table chooses the higher numbered Type and vernier to be eliminated. What this determination generates are a series of event enables. The event types and verniers will have the corresponding event enable signals disabled. A logical "AND" of the enable signals with the event valid signals determines which event data values will be invalidated (AND gates in FIG. 25). This effectively removes them from generating any operations in the event generator.

In each of these cases, one of the matching vernier pipelines will remain valid. This vernier pipeline will have its corresponding window strobe enable signal asserted. The window strobe enable signal marks both the vernier and the type of event that the window strobe is associated with. All of the rules outlined above only apply to valid window strobe event types.

As shown in FIG. 18, the window strobe logic 38 synchronizes the window strobe output to the vernier data that generates the window strobe condition. Accordingly, during normal operations, all vernier delay and event types are valid in the same clock cycle. Thus, all window strobes will be valid at the same point in each event. During scaling operations, the vernier values may be spread across many master clock cycles. Thus, window strobes may occur at any point in the scaled event clock cycle, and will correspond to the triggering vernier data.

FIGS. 27A–27B to FIGS. 31A–31B are timing diagrams showing examples of operation in the present invention. The timing diagrams show the following signals:

"M_CLK": a master clock.

"START": a start signal which signals the beginning of summing and scaling processing. All state machines are to re-initialize all pipe lines.

"CONTINUE": a continue signal which signals that all processing should resume. No initialization is required of the pipeline logic.

"ECR_ADR[17:0]": address data on event count memory address bus.

"ECR_AP_INC": event count memory address pointer increment. This signal increments the event count address pointer.

"ECR_CNTR[26:0]": an event counter count value (event counter 42 in FIG. 7). The event counter 42 is a 27-bit counter into which up to four segments of event count data will be loaded.

"ECR_CNT_LD[3:0]": event counter load strobes (event count state machine 41 and event counter 42 in FIG. 7) The event counter 42 has four loadable segments (single word to quad word in FIG. 9).

"EVT_PIPE_EN": main event vernier pipeline enable (input of event vernier state machine 56 in FIG. 12A).

"ECR_CNTR_TC": an event counter's terminal count output (output of event counter 42 in FIG. 7). The terminal count for this counter occurs at "2" in FIGS. 29A–31B.

"EVT_TRIG": an event trigger signal (output of event count state machine 41 in FIG. 7, and input of event scaling logic in FIG. 18). This is the main enable from the event count state machine that enables the output of vernier data.

"EVR_ADR[17:0]": address data on event vernier memory address bus.

"EVR_AP_INC": event vernier memory address pointer increment. This signal increments the event vernier address pointer.

"EVNT_CNT[1:0]": data showing a number of event verniers (EVCNT in FIG. 9). This is the number of vernier events in this event count cycle.

"EVR_PTR [2:0]": an event vernier memory pointer used by the pre-fetch logic for determining the vernier pipeline containing vernier 0.

"EVR_PREF_LD[1:0]": event vernier pre-fetch load enable. These signals control the loading of the event vernier pre-fetch registers (FIG. 12B).

"SCALE_MODE": a scale mode signal (output of event count scaling logic in FIG. 16). During scaling operations, this signal controls the loading of the scaling accumulators for each vernier pipeline.

"ZERO_CY_FLG": an output from the event count state machine 41 in FIG. 7 to the carry-sum state machine 71 in FIG. 14. This flag means that the carry-sum state machine should not add a cycle if a carry is detected.

"ONE_CY_FLG": a combinational signal that flags the present cycle as containing a single event clock count.

"EXTRA_CY_EN": an output from the carry-sum state machine 71 in FIG. 14 to the scale counter logic 93 in FIG. 16 that requests the addition of one event clock count.

"CARRY_SUM": an output from the vernier 0 accumulator in FIG. 14 that indicates that there has been a carry bit generated.

"VER_DAT_nP[6:0]": vernier data for a pipeline "n" (FIG. 12B. This data includes both delay and event type.

"VER_ENBL_nP": vernier data enable for a pipeline "n". This is equivalent to the event enable of FIG. 19H for the event generator 24 to generates an event by adding the delay time specified by the scaled vernier sum data.

"PERIOD_T": a period signal used to mark the start of a scaled clock cycle (output of FIG. 16) and to support the event generator operations.

"WSTB": a window strobe (output of FIG. 18). The window strobe is generated when the event type and vernier delay of two consecutive events match the predetermined conditions.

FIGS. 27A–27B and 28A–28B show examples of how the event count and event vernier pipeline should operate. In this example, the process starts at START by initialization of operations. The address ECR_ADR[17:0] for the event count memory 20 is incremented by the increment signal ECR_AP_INC. The address EVR_ADR[17:0] for the event vernier memory 21 is incremented by the increment signal EVR_AP_INC. The event counter 42 loads and processes one, two, three or four bytes event count data formats "ECR_CNTR[26:0]" in response to event counter load strobes ECR_CNT_LD[3:0]".

By counting the clock by a number of times specified in the event count data, the event counter 42 produces a terminal count output "ECR_CNTR_TC" which is applied to the event count state machine 41. In response, the event count state machine 41 produces the event trigger signal "EVT_TRIG" which is sent to the carry-sum state machine 71 for event vernier summing (FIG. 14) and event scaling logic (FIG. 18) for enabling the output of vernier data.

The number of vernier events in the particular event cycle is described by the "EVNT_CNT[1:0]" as a part of the event count data (FIG. 9). Based on this data, the event vernier memory pointer determines the vernier pipeline containing vernier 0 for the pre-fetch register "EVR_PTR[2:0]". Thus, vernier data are loaded in the event vernier pre-fetch registers (FIG. 12B) based on the event vernier pre-fetch load enable "EVR_PREF_LD[1:0]".

Figure 28A:
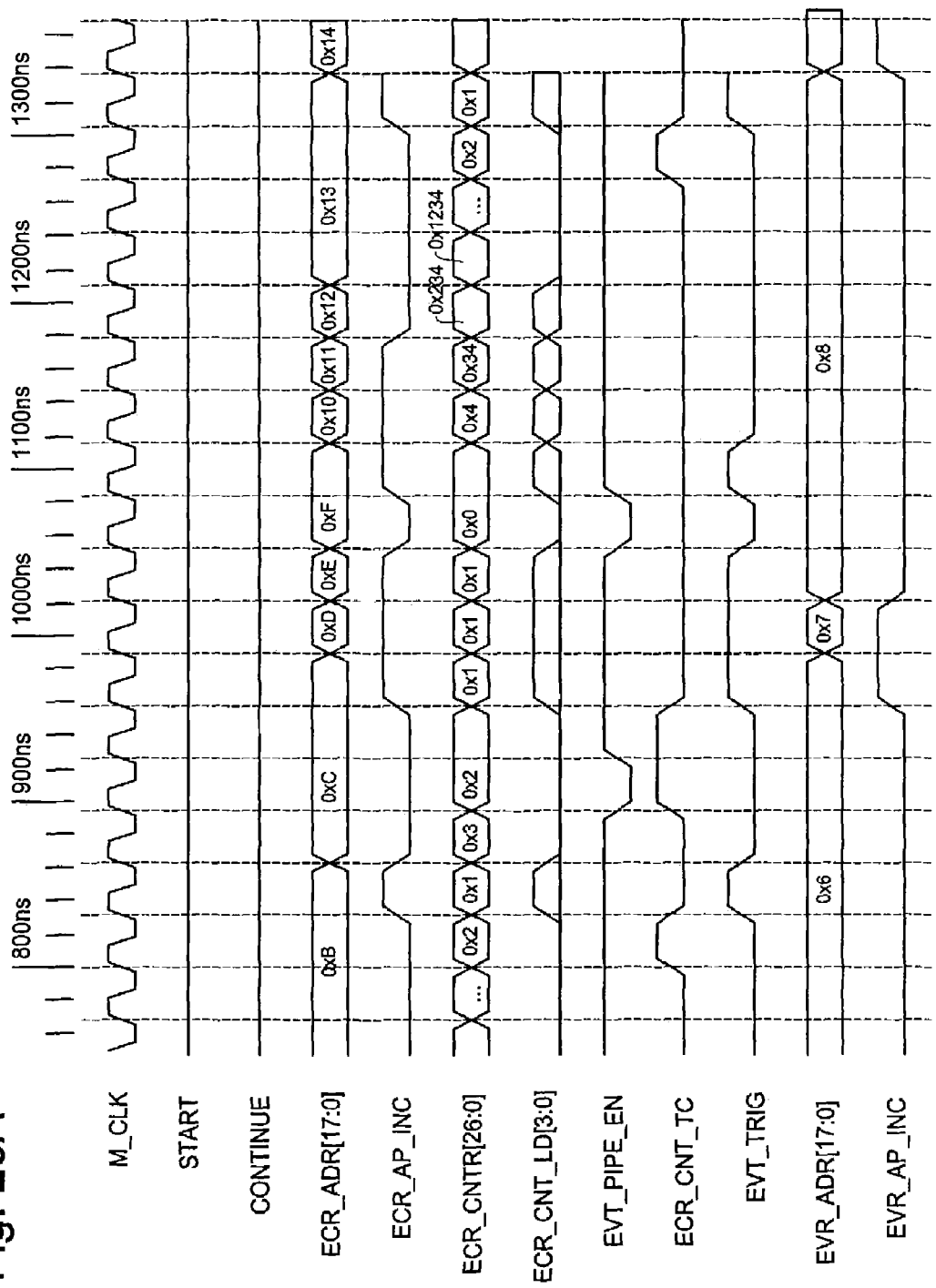
FIGS. 28A–28B are timing charts showing another example of operation of the event pipeline and vernier summing method and apparatus of the present invention when the scale factor is one (1).
Figure 28B:
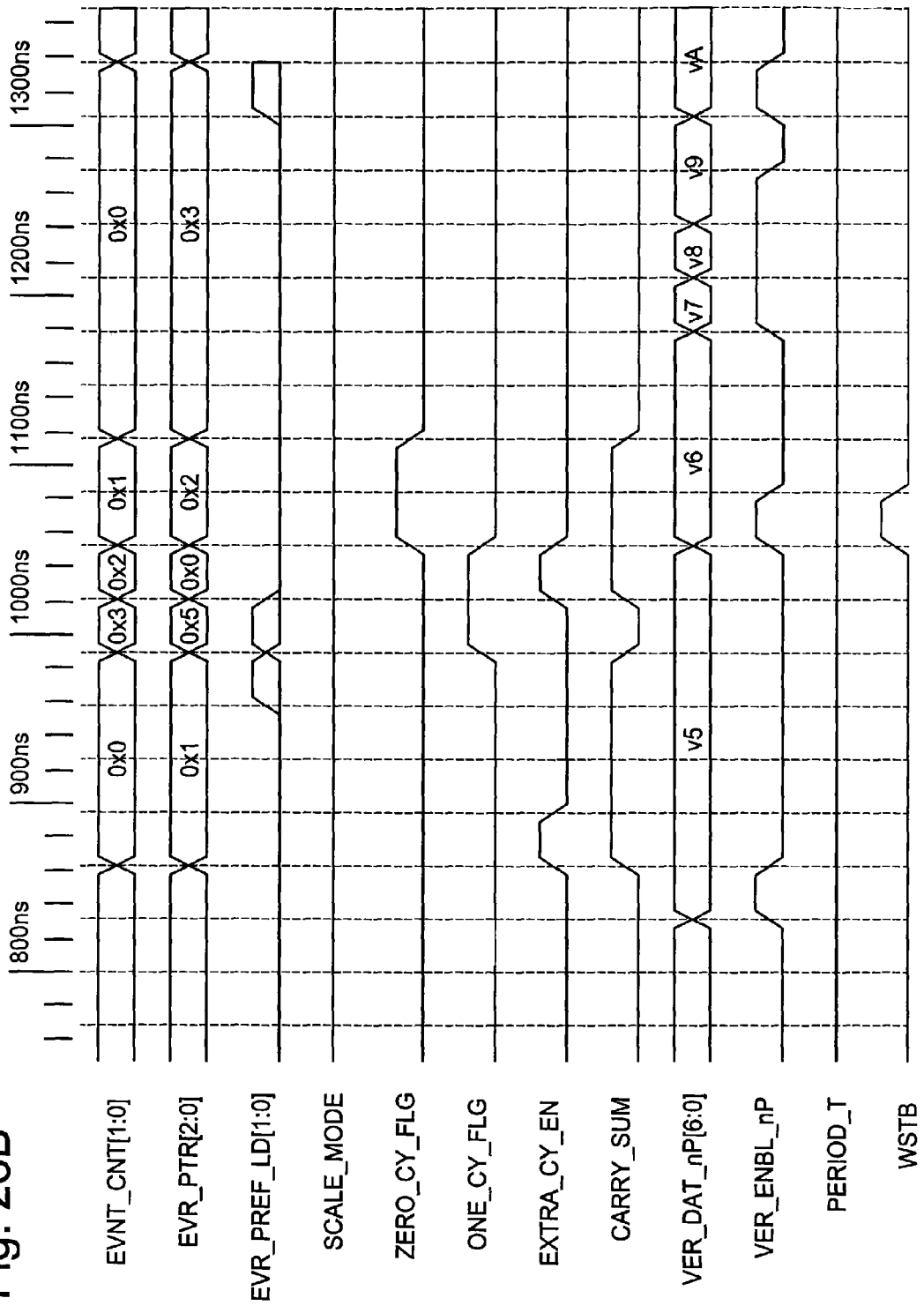
Figure 29A:
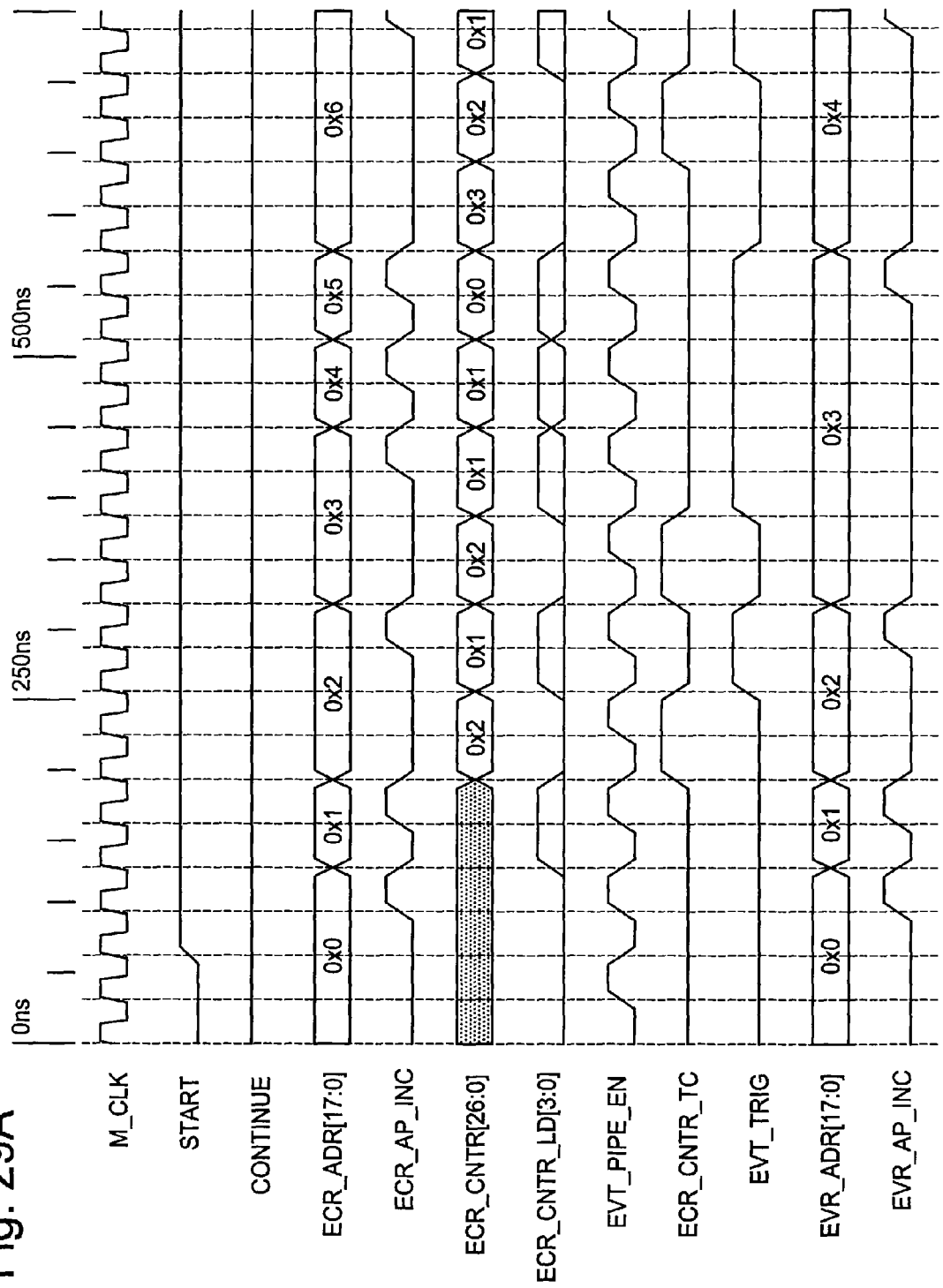
FIGS. 29A–29B are timing charts showing a further example of operation of the event pipeline and vernier summing method and apparatus of the present invention when the scale factor is two (2).
Figure 29B:
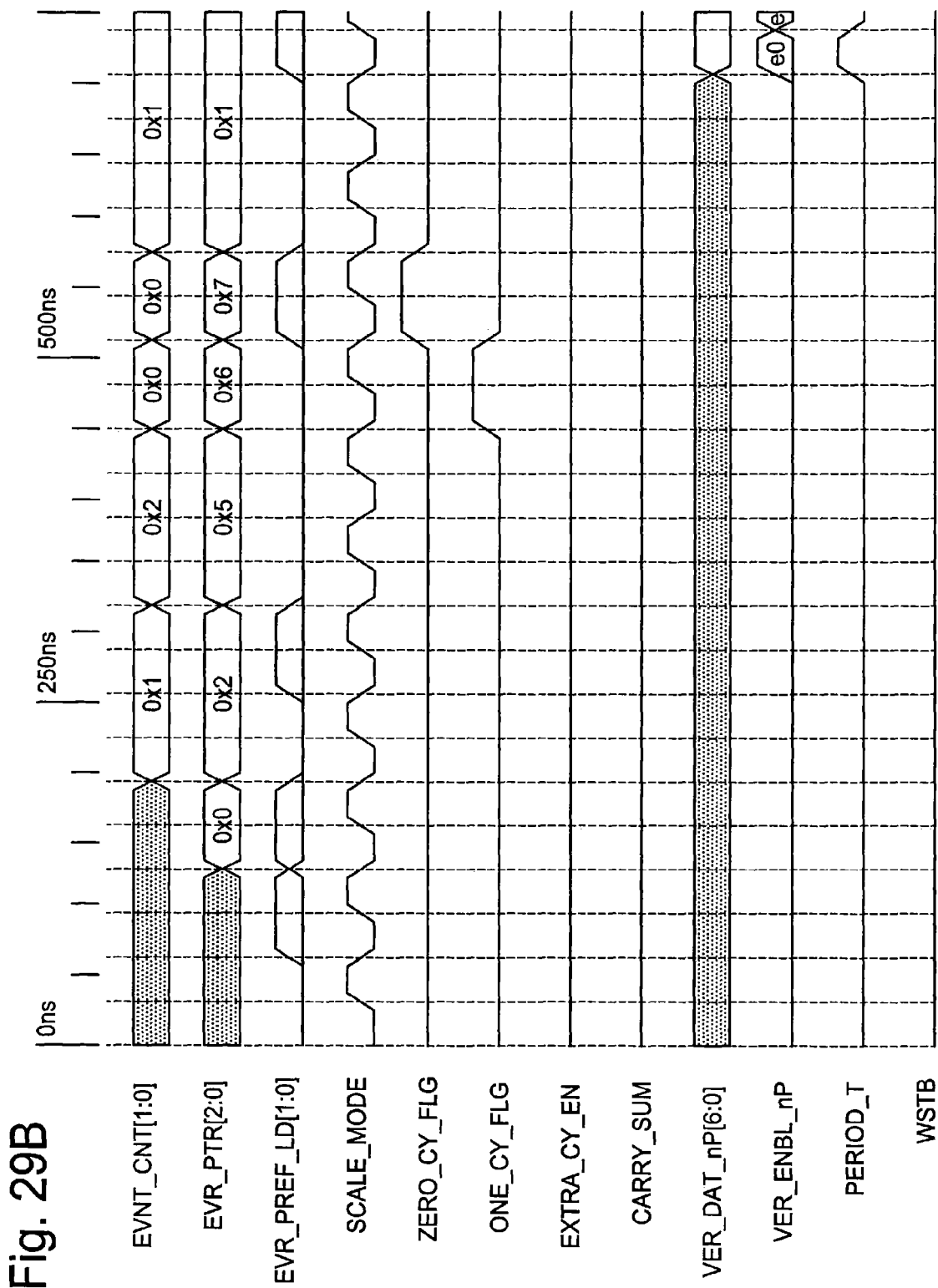
Figure 30A:
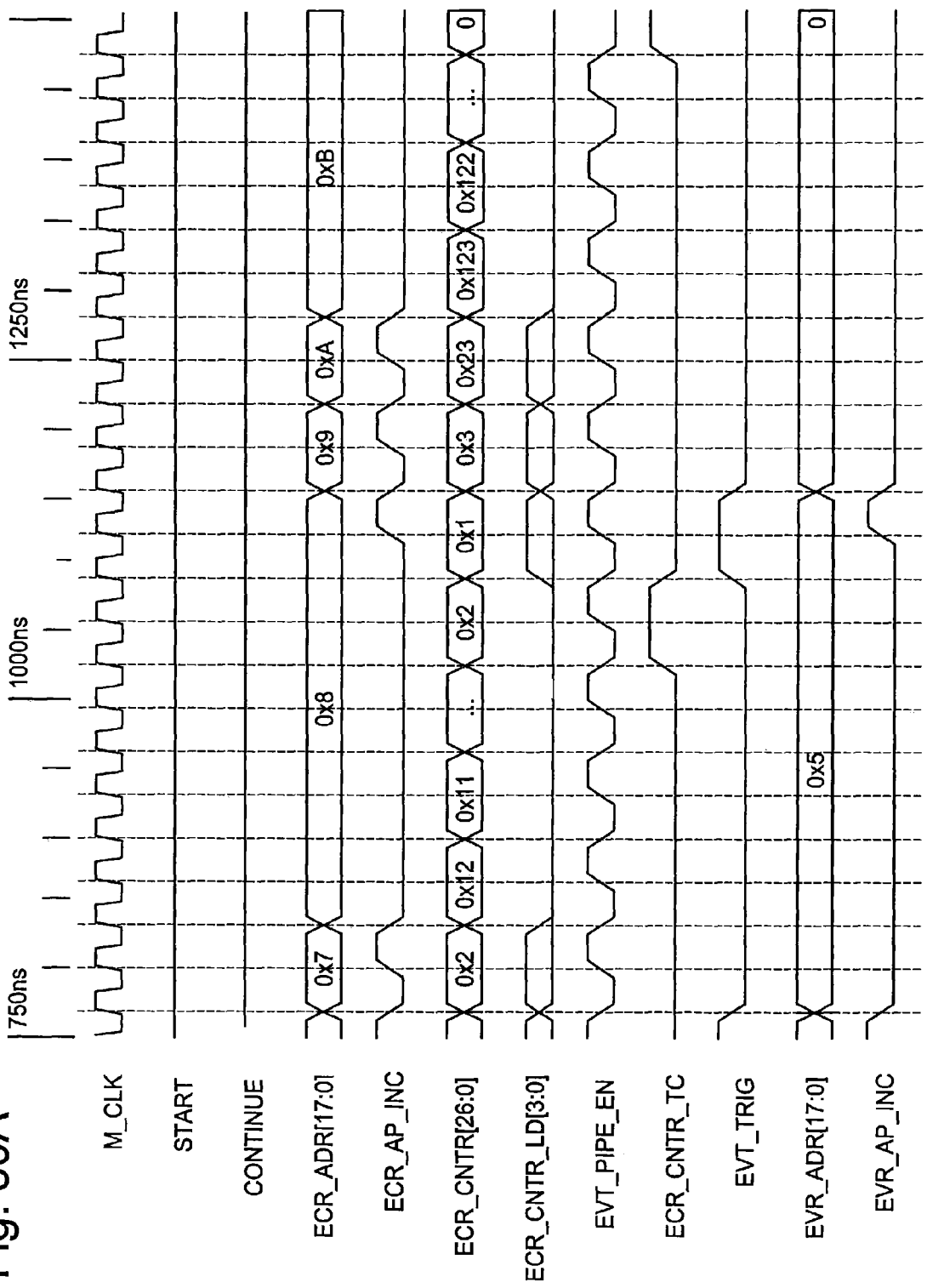
FIGS. 30A–30B are timing charts showing a further example of operation of the event pipeline and vernier summing method and apparatus of the present invention when the scale factor is two (2).
Figure 30B:
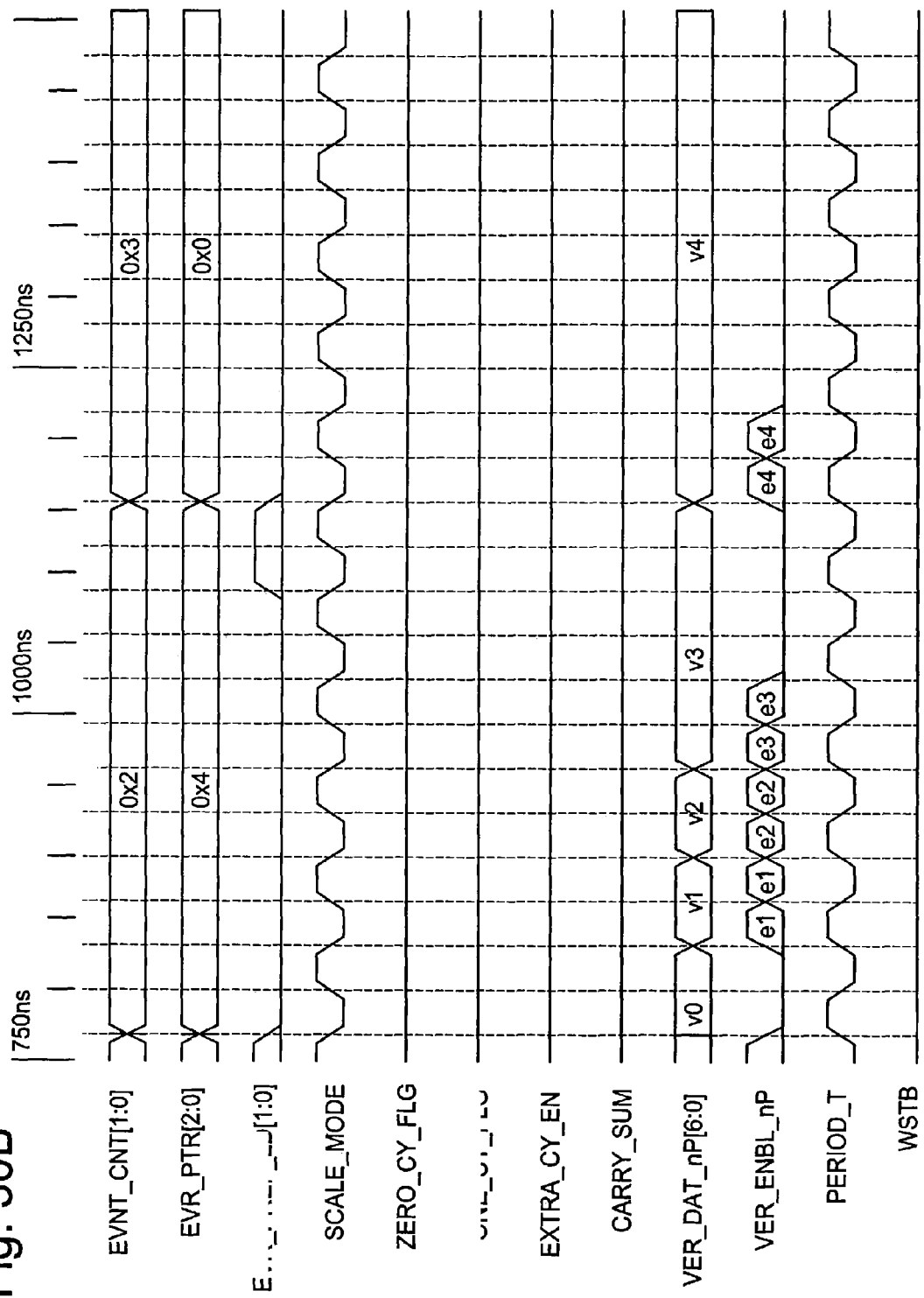

The process of FIG. 28B shows an operation for inserting an extra clock cycle due to a carry detected by the carry-sum state machine 71 in FIG. 14. The output "ZERO_CY_FLG" from the event count state machine 41 in FIG. 7 is sent to the carry-sum state machine 71 in FIG. 14 to request the event clock count. The carry-sum state machine 71 produces an extra cycle enable "EXTRA_CY_EN" which is sent to the scale counter logic 93 in FIG. 16 where the extra cycle is added at the AND logic.

The process in FIG. 28B also shows the window strobe generation. The window strobe logic 38 (FIG. 22) generates a window strobe output when two event vernier data (vernier delay and event type) match with each other. The window strobe WSTB is one form of vernier data enable and is generated by the same timing as that of the vernier data enable "VER_ENBL_nP" (event enable) in FIG. 28B by the circuit configuration of FIG. 18.

FIGS. 29A–29B, 30A–30B and 31A–31B show examples of how the event count and event vernier pipeline operates when a scale factor is "2". These diagrams are based on the timing shown in FIGS. 27A–27B and 28A and 28B, respectively. The scaled timing shows the effect of wait states during each clock cycle. Namely, the event count scaling logic of FIG. 16 inserts wait states into the event count state machine 41 equivalent to the scaling factor. Since the scale factor is "2", each event clock cycle uses two master clock cycles. Thus, in FIGS. 29A, 30A and 31A, the event count data, for example, is loaded in the event counter 42 at the rate of event clock having a clock cycle which is two times of the master clock. The period signals PERIOD_T in FIGS. 29B, 30B and 31B also show the same repetition rate as that of the event clock.

Figure 31A:
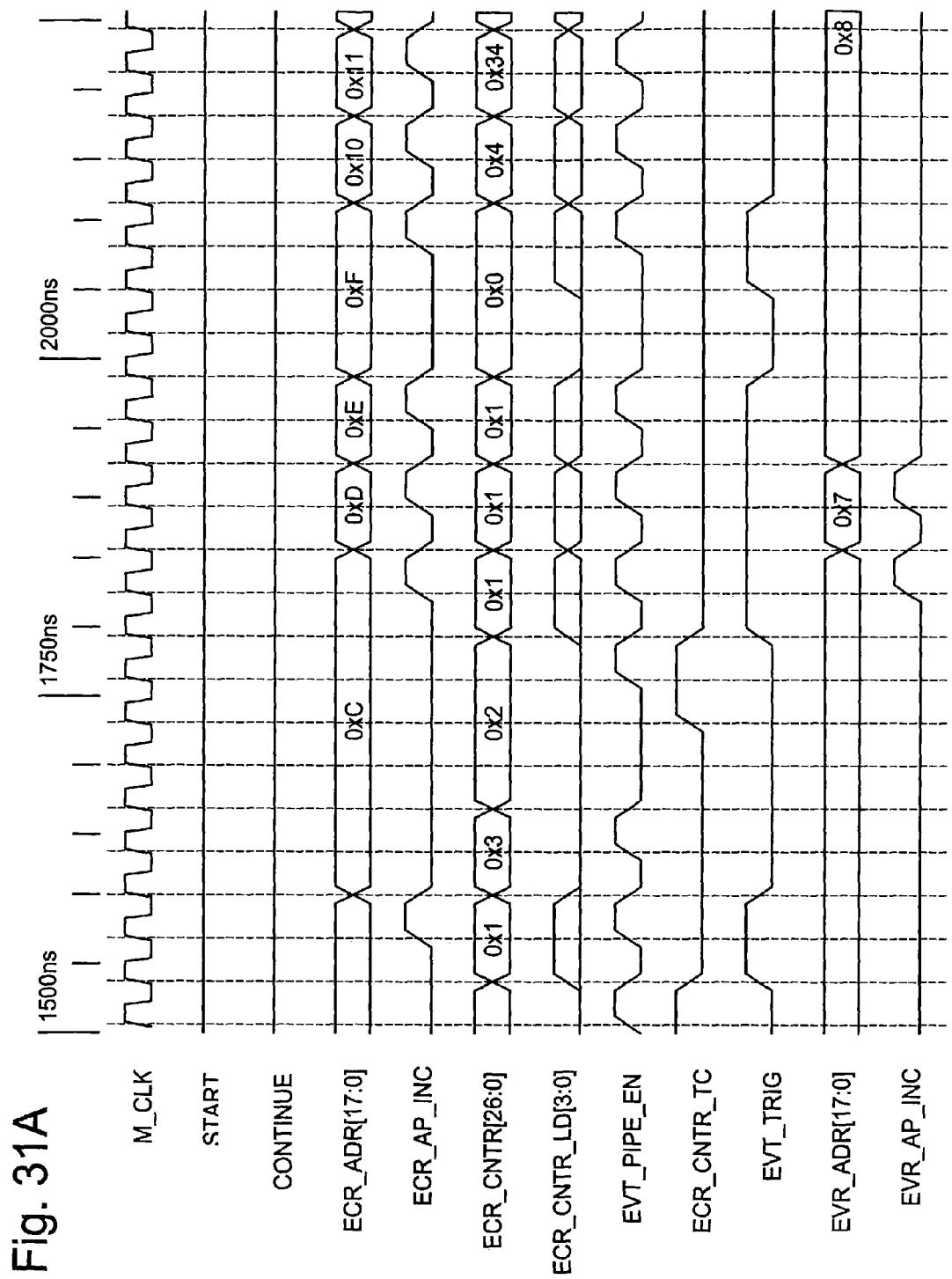
FIGS. 31A–31B are timing charts showing a further example of operation of the event pipeline and vernier summing method and apparatus of the present invention when the scale factor is two (2).
Figure 31B:
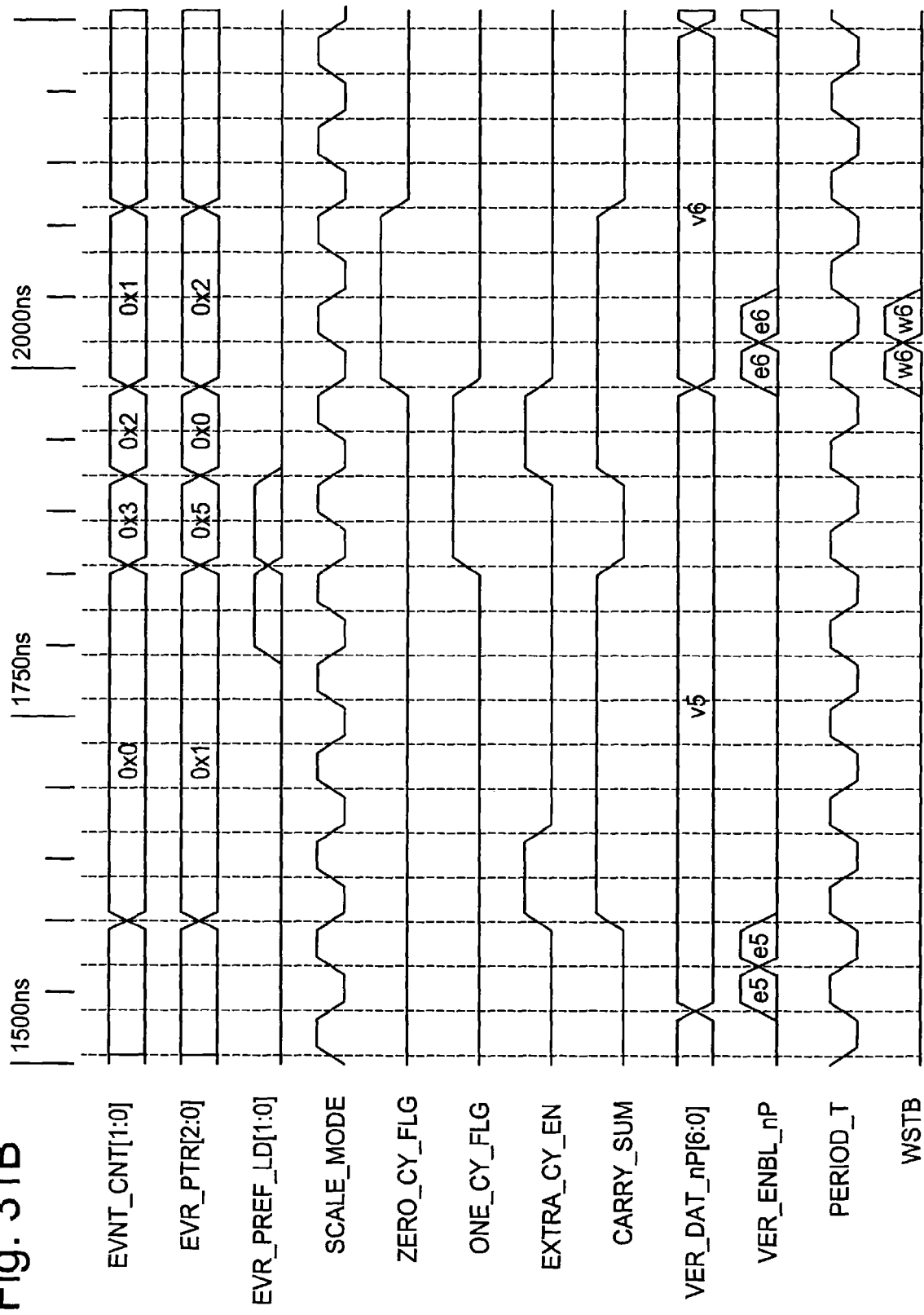

The example of FIGS. 31A–31B also shows the effect of scaling on the vernier data enable "VER_ENBL_nP" (event enable) and window strobe WSTB. These signals depend upon the scaled values generated for the vernier delay data. Thus, these signals occur in either of two master clock cycles. As noted above, the window strobe WSTB is generated by the same timing as that of the vernier data enable "VER_ENBL_nP" (event enable).

As has been described above, according to the present invention, the event processing for a high speed event based test system can be effectively performed to produce the drive events and strobe events. The event data are compressed by dividing into two or more small words or segments and processed through two or more pipelines in a parallel fashion. The decompression, summing and scaling processes are conducted through the pipeline structure of the present invention. The event pipeline and summing logic also includes the window strobe logic for interpreting the event data and generating the window strobe. As a result, the event pipeline and summation logic of the present invention achieves the high speed event processing and high operational stability in the event based test system.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event pipeline and summing apparatus for processing event data stored in an event memory of an event based test system, comprising:
   an event count delay logic which produces a gross delay of event count data, which is an integral part of the event data, by counting a clock by a number of times defined by the event count data;
   a vernier data decompression logic which reproduces event vernier data which is a fractional part of the event data;
   an event vernier summing logic which produces event vernier sum data by summing the vernier data from the vernier data decompression logic; and
   an event scaling logic which changes the event count data from the event count delay logic and the event vernier data from the event vernier summing logic in proportion to a scale factor;
   wherein a plurality of parallel pipelines are incorporated at least in the event vernier summing logic for processing the event vernier data in parallel where each pipeline is configured by a plurality of series connected registers.

2. An event pipeline and summing apparatus as defined in claim 1, further comprising a window strobe logic which operates to generate a window strobe when event data of two consecutive events match with one another.

3. An event pipeline and summing apparatus as defined in claim 2, wherein the window strobe logic includes:
   a vernier data comparison logic which differentiates a window strobe event from other events by comparing event type data of two consecutive events and provides a window strobe signal to the event scaling logic.

4. An event pipeline and summing apparatus as defined in claim 1, wherein said event count data for each event is configured by one or more words where each word of said event count data is stored in a different address of the event memory.

5. An event pipeline and summing apparatus as defined in claim 1, wherein said event vernier data for each event is configured by vernier delay data and event type data, and wherein said event vernier data for each event is divided into one or more segments, and wherein each segment of said event vernier data is stored in the same or different address of the event memory.

6. An event pipeline and summing apparatus as defined in claim 1, wherein the event count delay logic includes;
   an event counter which loads the event count data and counts the event count data by the clock and produces a terminal count signal when a count result reaches a predetermined value; and
   a state machine which controls an overall operation of the event pipeline and summing apparatus including a process for loading the event count data into the event counter and a process for generating an event trigger signal in response to the terminal count signal from the event counter.

7. An event pipeline and summing apparatus as defined in claim 1, wherein said event vernier data for each event is divided into one or more segments, and wherein said vernier data decompression logic includes:
   a plurality of pre-fetch registers to pre-fetch the one or more segments of the event vernier data;
   a plurality of loop storage registers which store the vernier data from the pre-fetch registers for performing a loop operation on the segments of the event vernier data; and
   a state machine which controls an operation of the vernier data decompression logic including at least an operation of the pre-fetch registers and loop storage registers.

8. An event pipeline and summing apparatus as defined in claim 1, wherein said event vernier data for each event is divided into base vernier and one or more other verniers, and wherein said event vernier summing logic includes:
   a base accumulator which accumulates vernier delays of the base verniers for all of previous and current events;

a plurality of accumulators which accumulate vernier delays of other verniers for all of previous and current events on an accumulated result of the base verniers from the base accumulator; and a state machine which controls an overall operation of the event vernier summing logic including sending an instruction to the event scaling logic to insert one cycle of wait state into a current event count cycle when a carry arises in accumulating the vernier delays.

9. An event pipeline and summing apparatus as defined in claim 1, wherein the event scaling logic includes:

an event vernier scaling logic which produces an event enable signal for each pipeline by scaling the vernier sum data from the event vernier summing logic by the scale factor; and an event count scaling logic which produces an event clock based on the scale factor and provides the event clock to the event count delay logic.

10. An event pipeline and summing apparatus as defined in claim 9, wherein said event count scaling logic includes:

a scaling counter logic for counting the clock when the event count scaling starts;

a comparator which compares an output of the scaling counter logic and the scale factor and produces a terminal count signal when the output of the scaling counter logic reaches a value one less than the scale factor; and an AND logic which produces the event clock based on the terminal count signal from the comparator and an extra cycle request from the event vernier summing logic.

11. An event pipeline and summing apparatus as defined in claim 9, wherein said event vernier scaling logic includes:

an accumulator for accumulating the vernier sum data from the event vernier summing logic by a number of times one less than the scale factor.

12. An event pipeline and summing method for processing event data stored in an event memory of an event based test system, comprising the following steps of:

producing a gross delay of event count data, which is an integral part of the event data from the event memory, by counting a clock by a number of times defined by the event count data;

decompressing event vernier data which is a fractional part of the event data in the event memory;

summing the event vernier data based on the decompressed event vernier data through a plurality of pipelines arranged in parallel and shifting the event vernier data at each timing of the clock to produce event vernier sum data where each pipeline is configured by a plurality of series connected registers; and modifying the event count data and the event vernier data in proportion to a scale factor.

13. An event pipeline and summing method as defined in claim 12, further comprising the step of interpreting the event vernier data and generating a window strobe when the event vernier data of two consecutive events match with one another.

14. An event pipeline and summing method as defined in claim 13, wherein said step of generating the window strobe includes a step of differentiating a window strobe event from other events by comparing event type data of two consecutive events.

15. An event pipeline and summing method as defined in claim 12, wherein said step of producing the gross delay of event count data includes the steps of:

counting the event count data by the clock and producing a terminal count signal when a count result reaches a predetermined value; and generating an event trigger signal in response to the terminal count signal.

16. An event pipeline and summing method as defined in claim 12, wherein said event vernier data for each event is divided into base vernier and one or more other verniers, and wherein said step of summing the event vernier data includes the steps of:

accumulating vernier delays of the base verniers for all of previous and current events;

accumulating vernier delays of other verniers for all of previous and current events on an accumulated result of the base verniers; and requesting an insertion of one cycle of wait state into a current event count cycle when a carry arises in accumulating the vernier delays.

17. An event pipeline and summing method as defined in claim 12, wherein said step of modifying the event count data and the event vernier data includes the steps of:

scaling the vernier sum data by the scale factor and producing an event enable signal for each pipeline; and producing an event clock based on the scale factor and producing the gross delay of event count data by counting the event clock.

18. An event pipeline and summing method as defined in claim 17, wherein said step of producing the event clock includes the steps of:

counting the clock;

comparing the count result and the scale factor and producing a terminal count signal when the count result reaches a value which is one less than the scale factor; and generating the event clock based on the terminal count signal.

19. An event pipeline and summing method as defined in claim 18, wherein said step of scaling the vernier sum data by the scale factor includes a step of accumulating the vernier sum data by a number of times one less than the scale factor.

* * * * *